(12) United States Patent
Taniguchi et al.

(10) Patent No.: US 10,547,147 B2
(45) Date of Patent: Jan. 28, 2020

(54) PLUG CONNECTOR AND ADAPTER WITH THERMAL PROTECTION CIRCUIT TO DISCONTINUE CURRENT SUPPLY WHEN OVERHEATING OCCURS

(71) Applicant: Hosiden Corporation, Yao-shi, Osaka (JP)

(72) Inventors: Keiichi Taniguchi, Yao (JP); Katsutoshi Yamamoto, Yao (JP)

(73) Assignee: HOSIDEN CORPORATION, Yao-Shi (JP)

(*) Notice: Subject to any disclaimer, the term of this patent is extended or adjusted under 35 U.S.C. 154(b) by 541 days.

(21) Appl. No.: 15/289,308

(22) Filed: Oct. 10, 2016

(65) Prior Publication Data
US 2017/0110837 A1 Apr. 20, 2017

(30) Foreign Application Priority Data
Oct. 14, 2015 (JP) .................. 2015-202574

(51) Int. Cl.
*H01R 13/713* (2006.01)
*H01R 12/53* (2011.01)
(Continued)

(52) U.S. Cl.
CPC ......... *H01R 13/7137* (2013.01); *H01R 12/53* (2013.01); *H01R 13/405* (2013.01);
(Continued)

(58) Field of Classification Search
CPC ............... A24F 15/18; A24F 47/008; A61H 2201/0207; G06F 1/1632; G06F 13/382;
G06F 13/409; H01R 12/53; H01R 12/707; H01R 12/716; H01R 13/405; H01R 13/46; H01R 13/502; H01R 13/58; H01R 13/6461; H01R 13/6471; H01R 13/6477; H01R 13/6594; H01R 13/66; H01R 13/6666; H01R 13/6683; H01R 13/7137;
(Continued)

(56) References Cited

U.S. PATENT DOCUMENTS

| 8,215,981 B2* | 7/2012 | Liu ................. G06F 13/409 361/679.54 |
| 8,498,087 B2* | 7/2013 | Rabu ................. H01R 31/065 361/104 |

(Continued)

*Primary Examiner* — Thienvu V Tran
*Assistant Examiner* — Nicolas Bellido
(74) *Attorney, Agent, or Firm* — Rankin, Hill & Clark LLP

(57) ABSTRACT

The invention provides a plug connector which, when abnormal heating occurs in a fitting portion with a counter connector, can sensitively cut off the current supply. The plug connector has: contacts; a body that holds the contacts; a metal shell that covers the body; and a printed circuit board on which the contacts are solder-connected. The body has a fitting portion with a counter connector. The board has a thermal protection circuit. The thermal protection circuit has a temperature switch that detects a temperature, and an FET that is disposed in a power supply wiring of the board. When the detected temperature of the temperature switch exceeds a predetermined temperature, the power supply wiring is cut off by the FET. In the plug connector, the board has a heat conduction pattern that conducts heat of the metal shell 60 to the temperature switch.

15 Claims, 30 Drawing Sheets

(51) Int. Cl.
  *H01R 13/405* (2006.01)
  *H01R 13/66* (2006.01)
  *H01R 24/62* (2011.01)
  *H01R 31/06* (2006.01)
  *H01R 107/00* (2006.01)

(52) U.S. Cl.
  CPC ......... *H01R 13/6683* (2013.01); *H01R 24/62* (2013.01); *H01R 31/065* (2013.01); *H01R 2107/00* (2013.01)

(58) Field of Classification Search
  CPC .... H01R 2107/00; H01R 24/60; H01R 24/62; H01R 24/64; H01R 31/065; H01R 4/027; H01R 9/03; H02J 2007/0062; H02J 7/047; H02J 7/355; H05K 1/0263; H05K 2201/10969; H05K 3/429; H05K 5/0278; H05K 1/0203; H05K 1/0204; H05K 1/0207; H05K 1/0209; H05K 1/021; H05K 1/0212

USPC ................. 361/93.8, 103, 104, 105, 106; 439/620.06, 620.22
  See application file for complete search history.

(56) References Cited

U.S. PATENT DOCUMENTS

| | | | |
|---|---|---|---|
| 9,106,024 B2* | 8/2015 | Zhao | H01R 13/6581 |
| 2011/0188207 A1* | 8/2011 | Won | G06F 1/20 |
| | | | 361/709 |
| 2015/0171562 A1* | 6/2015 | Gao | H01R 13/6582 |
| | | | 439/345 |
| 2015/0288110 A1* | 10/2015 | Taniguchi | H01R 13/46 |
| | | | 439/620.22 |
| 2017/0194754 A1* | 7/2017 | Tsai | H01R 13/502 |
| 2017/0201050 A1* | 7/2017 | Akita | H01B 11/00 |
| 2017/0214193 A1* | 7/2017 | Tsai | H01R 13/502 |

* cited by examiner

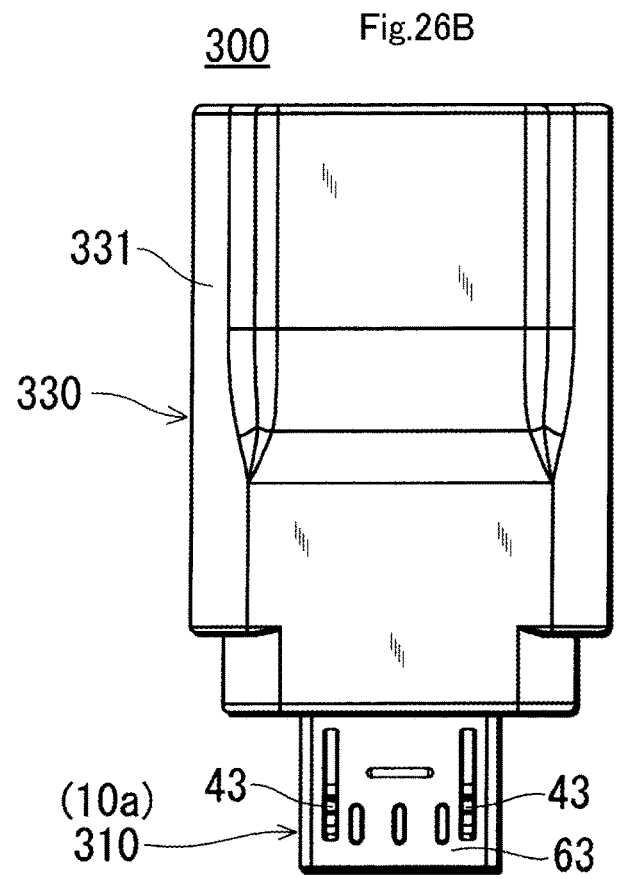
Fig.26B
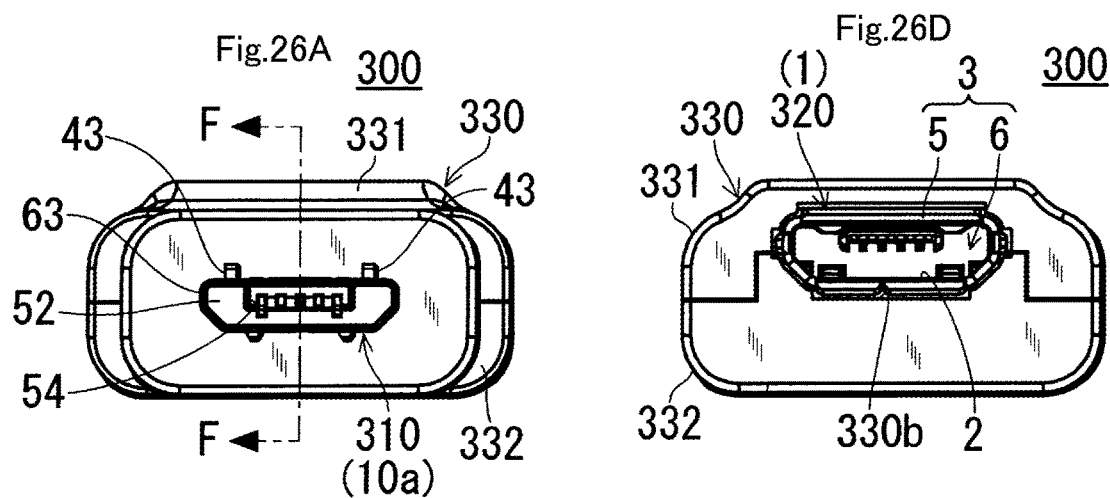
Fig.26A
Fig.26D
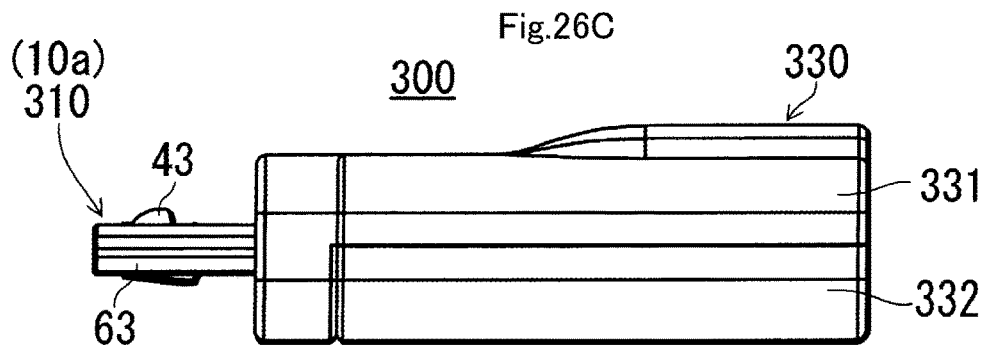
Fig.26C

PLUG CONNECTOR AND ADAPTER WITH THERMAL PROTECTION CIRCUIT TO DISCONTINUE CURRENT SUPPLY WHEN OVERHEATING OCCURS

TECHNICAL FIELD

The present invention relates to a plug connector and adapter which include a thermal protection circuit that detects abnormal heating, and that cuts off a current supply.

BACKGROUND ART

Conventionally, a cable is known which includes two connectors and a thermal protection circuit (Patent Literature 1). Patent Literature 1 discloses a configuration where a connector which is connected to one end of the cable is a male USB connector, and that which is connected to the other end of the cable is a 30-pin connector. When the cable is used, an iPod (registered trademark), iPhone (registered trademark), or iPad (registered trademark) manufactured by Apple Inc. can be connected to and charged through a USB port of a personal computer directly or via an adapter named Lightening (registered trademark). When the cable is connected to a USB power adapter, such a device can be charged through an outlet. The thermal protection circuit is mounted on a printed circuit board in the 30-pin connector. The thermal protection circuit includes a temperature sensing element (thermistor) and a power cutoff switch (FET). The power cutoff switch is disposed in a circuit board conductor path elongating between cable conductors for power supply and connector pins, and cuts off the power supply when the temperature sensing element detects a temperature which is higher than a predetermined temperature.

PRIOR ART LITERATURE

Patent Literature

Patent Literature 1 U.S. Pat. No. 8,498,087

SUMMARY OF THE INVENTION

Problem to be Solved by the Invention

In the cable disclosed by Patent Literature 1, the 30-pin connector including the thermal protection circuit does not have a structure which can efficiently conduct heat of a fitting portion with a counter connector to the temperature sensing element, and there is a problem in that, when abnormal heating occurs in the fitting portion, the current supply cannot be sensitively cut off.

In view of the problem, it is an object of the invention to provide a plug connector and adapter which, when abnormal heating occurs in a fitting portion with a counter connector, can sensitively cut off the current supply.

Means for Solving the Problem

The invention as described herein is characterized in that a plug connector comprises: a plurality of contacts; a body which holds the contacts; a metal shell which covers the body; and a printed circuit board to which the contacts are solder-connected, the body comprises a fitting portion which is projected, and which is to be fitted with a counter connector, the printed circuit board comprises a thermal protection circuit, and the thermal protection circuit comprises: a temperature switch IC which detects a temperature; and an FET which is disposed in a power supply wiring of the printed circuit board, and, when a detected temperature of the temperature switch IC exceeds a predetermined temperature, causes the FET to cut off the power supply wiring, wherein the printed circuit board comprises a heat conduction pattern which conducts heat of the metal shell to the temperature switch IC.

The invention as described herein is characterized in that the plug connector the heat conduction pattern comprises a portion which overlaps with the temperature switch IC in the thickness direction of the printed circuit board.

The invention as described herein is characterized in that the plug connector the printed circuit board is a multi-layer board, the temperature switch IC is surface-mounted on the printed circuit board, the heat conduction pattern is disposed on at least one surface layer of the printed circuit board, and comprises: a shell connection land to which the metal shell is solder-connected; an inner-layer conductor pattern that is disposed on an inner layer adjacent to the surface layer of the printed circuit board on which the temperature switch IC is mounted; a via which connects between the shell connection land and the inner-layer conductor pattern; and a temperature switch IC connection land that is disposed on the surface layer of the printed circuit board on which the temperature switch IC is mounted, a pad that is disposed on a lower surface of the temperature switch IC being solder-connected to the temperature switch IC connection land, and the inner-layer conductor pattern comprises a portion which overlaps with the temperature switch IC connection land in the thickness direction of the printed circuit board.

The invention as described herein is characterized in that the plug connector the heat conduction pattern further comprises another via which connects between the inner-layer conductor pattern and temperature switch IC connection land that overlap with each other in the thickness direction of the printed circuit board.

The invention as described herein is characterized in that the plug connector the temperature switch IC is surface-mounted on the printed circuit board, and the heat conduction pattern is disposed on only the surface layer of the printed circuit board on which the temperature switch IC is mounted, and comprises: a shell connection land to which the metal shell is solder-connected; and a temperature switch IC connection land which is connected to the shell connection land, and to which a pad that is disposed on a lower surface of the temperature switch IC is solder-connected.

The invention as described herein is characterized in that the plug connector the temperature switch IC comprises the FET.

The invention as described herein is characterized in that the plug connector the plug connector further comprises a cable which is solder-connected to the printed circuit board.

The invention as described herein is characterized in that an adapter comprises the plug connector according to any one of 1 to 6 above, as a first connector, and further comprises: a second connector which is mounted on the printed circuit board of the first connector; and a housing which covers the printed circuit board in a state where the first connector and the second connector are fittable to respective counter connectors.

Effects of the Invention

The printed circuit board comprises the heat conduction pattern which conducts heat of the metal shell to the temperature switch IC, and abnormal heating occurring in the fitting portion with a counter connector is conducted from the metal shell to the heat conduction pattern of the printed circuit board. Therefore, it is possible to provide a plug connector and adapter which, when abnormal heating occurs in the fitting portion with a counter connector, can sensitively cut off the current supply.

The printed circuit board is used as a member through which heat is conducted from the metal shell to the temperature switch IC. Therefore, it is not necessary to additionally dispose a heat conductive member.

BRIEF DESCRIPTION OF THE DRAWINGS

FIG. 11A is a bottom view of a temperature switch IC, FIG. 11B is a plan view of the heat conduction pattern included in the surface layer of the upper surface of a printed circuit board, FIG. 11C is a plan view of the heat conduction pattern included in the inner layer of the printed circuit board, and FIG. 11D is a plan view of the heat conduction pattern included in the surface layer of the lower surface of the printed circuit board.

FIG. 17A is a plan view showing the heat conduction pattern included in the surface layer of the upper surface of a printed circuit board, FIG. 17B is a plan view showing the heat conduction pattern included in the inner layer of the printed circuit board, and FIG. 17C is a plan view showing the heat conduction pattern included in the surface layer of the lower surface of the printed circuit board.

FIG. 25A is a perspective view of the adapter as viewed from an obliquely upper front side, and FIG. 25B is a perspective view of the adapter as viewed from an obliquely upper rear side.

FIGS. 26A to 26D are views showing the adapter of Embodiment 4 of the invention, FIG. 26A is a front view of the adapter, FIG. 26B is a plan view of the adapter, FIG. 26C is a right-side view of the adapter, and FIG. 26D is a rear view of the adapter.

BEST MODE FOR CARRYING OUT THE INVENTION

Embodiment 1

Embodiment 1 of the invention will be described with reference to FIGS. 1 to 16. FIGS. 1 to 9 show a plug connector (hereinafter, referred to as "plug") 10 of Embodiment 1. The plug 10 is a cable-side connector which is disposed in one end of a cable 20, and conforms to the micro-USB (2.0) standard. For example, a counter connector which is fitted (connected) to the plug 10 is an apparatus-side (board-side) connector disposed in a small portable electronic apparatus such as a smart phone or a tablet computer, i.e. a receptacle connector (hereinafter, referred to as "receptacle") 1 which conforms to the micro-USB (2.0) standard. The plug 10 is inserted into and fitted to the receptacle 1 in a state where they are opposed to each other. In the specification, the sides of the plug 10 and the receptacle 1 which are opposed to each other are referred to as "front", and the opposite sides are referred to as "rear".

Figure 21:
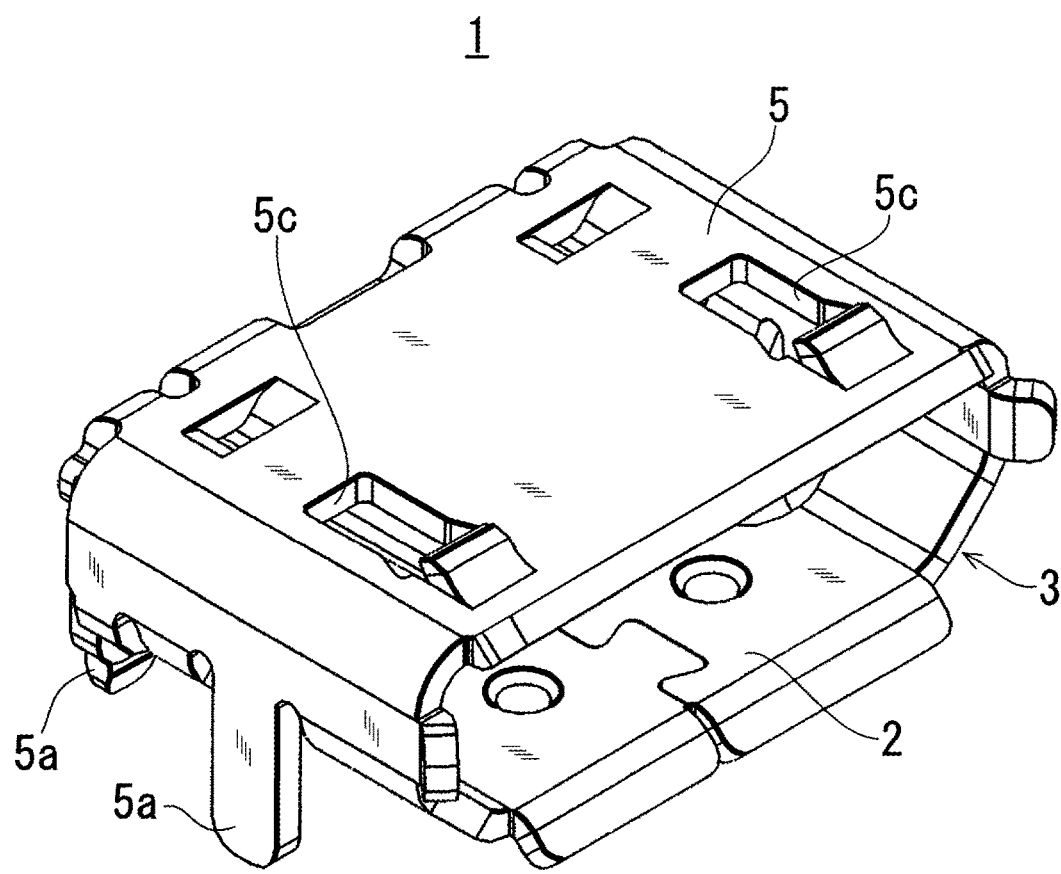
FIG. 21 is a perspective view of a receptacle connector functioning as a counter connector of the plug connectors of Embodiments 1 to 3 of the invention.
Figure 22:
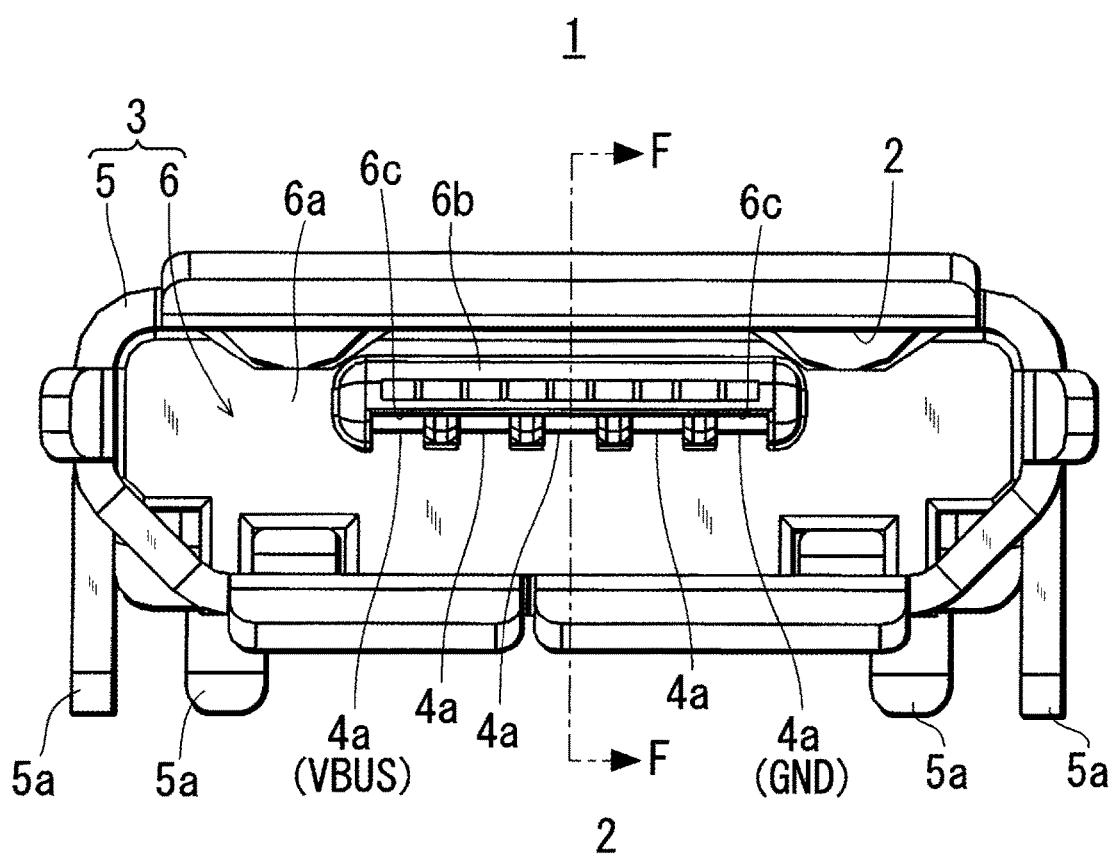
FIG. 22 is a front view of the receptacle connector functioning as a counter connector of the plug connectors of Embodiments 1 to 3 of the invention.
Figure 23:
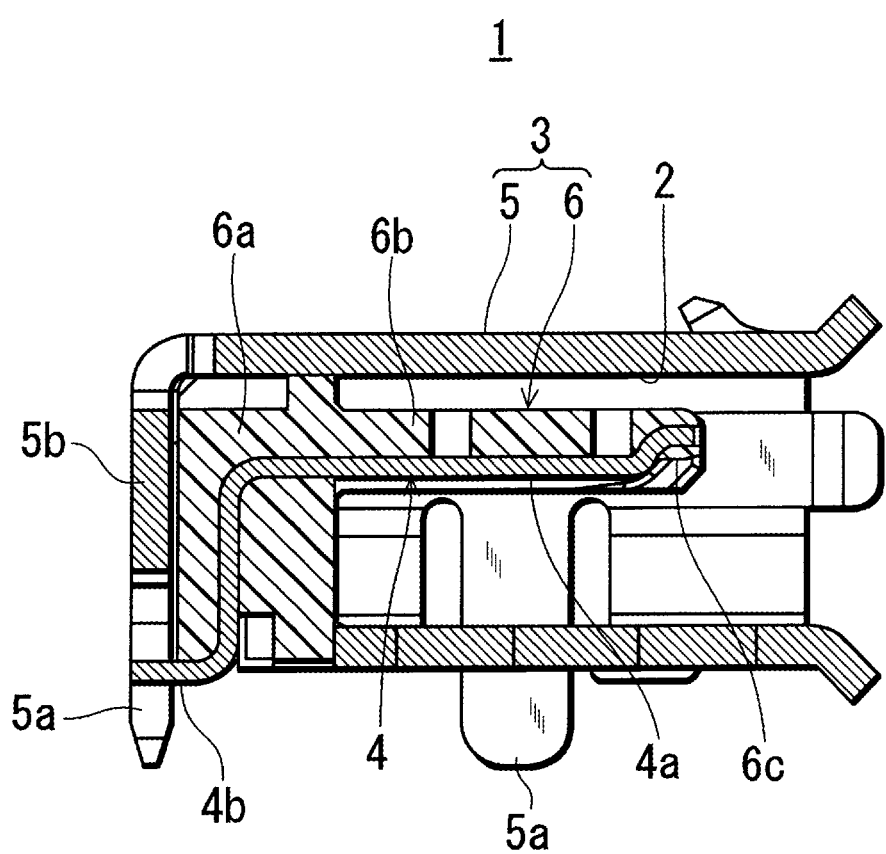
FIG. 23 is a sectional view taken along line F-F in FIG. 22.
Figure 24:
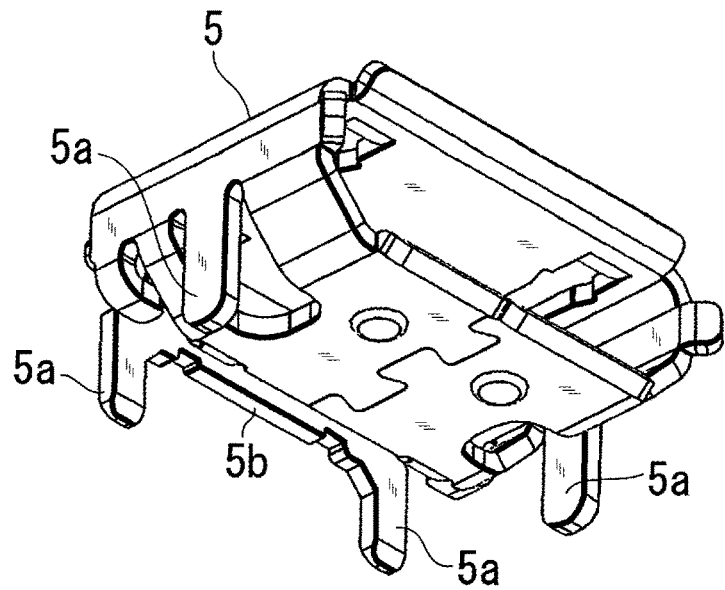
FIG. 24 is an exploded perspective view of the receptacle connector functioning as a counter connector of the plug connectors of Embodiments 1 to 3 of the invention.
Figure 24:
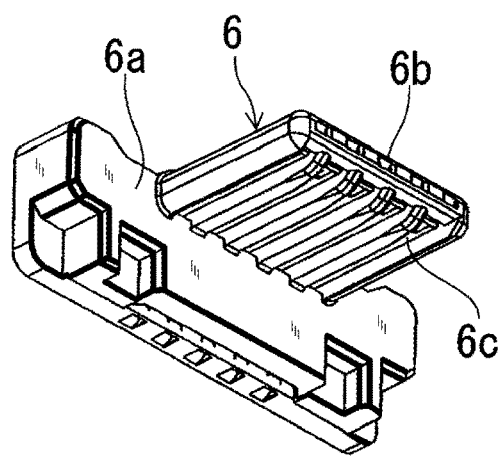
Figure 24:
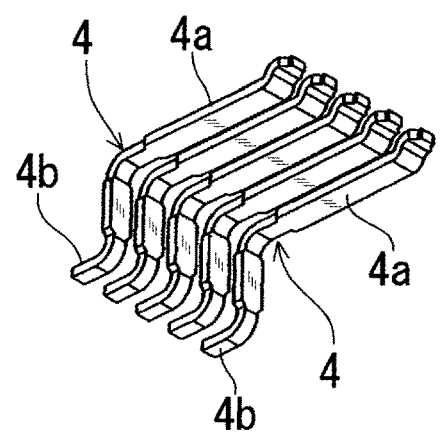

First, the receptacle 1 will be described with reference to FIGS. 21 to 24. FIG. 21 is a perspective view of the receptacle 1, FIG. 22 is a front view of the receptacle 1, FIG. 23 is a sectional view taken along line F-F in FIG. 22, and FIG. 24 is an exploded perspective view of the receptacle 1.

As shown in FIGS. 21 to 24, the receptacle 1 includes a housing 3 in which a plug inserting portion 2 into which the plug 10 is to be inserted is opened in the front side, and five contacts 4 which are held by the housing 3, and which are exposed in the plug insertion portion 2. The housing 3 includes a tubular metal shell 5 which is a sheet-metal made shield member, and an insulative body 6 which holds the contacts 4.

The sheet-metal made metal shell 5 is formed by punching and bending a conductive metal plate into a predetermined shape. In the metal shell 5, four soldering portions 5a which are solder-connected to a printed circuit board, a rear surface cover 5b, and a pair of latch holes 5c which are to be engaged with engaging portions 43 of latch members 40 of the plug 10 are integrally formed.

The body 6 is formed by molding an insulating synthetic resin material. The body 6 integrally includes a rear wall portion 6a which is fitted into a rear end portion of the metal shell 5, and a planar contact supporting portion 6b which is projected from the front surface of the rear wall portion 6a, and the contact supporting portion 6b is supported in a state where the portion is projected into the plug inserting portion 2. Five contact accommodating grooves 6c which are laterally arranged, and which longitudinally elongate are formed on the lower surface of the contact supporting portion 6b.

Each of the contacts 4 is sheet-metal made, formed by punching and bending a conductive metal plate which is thinner than the metal shell 5, into a predetermined shape, and then insert-molded integrally with the body 6 to be fixed. In the contact 4, a contact portion 4a which is to be contacted with a contact 30 of the plug 10 is embedded and fixed into the lower surface of the contact supporting portion 6b in a state where the lower surface of the contact portion is exposed along the corresponding contact accommodating groove 6c, and a soldering portion 4b which is to be soldered to the printed circuit board is extracted from a lower portion of the rear wall portion 6a to the outside.

The contacts 4 are arranged laterally in a row in the sequence of, from the left side toward the right side in FIG. 22, terminal No. 1 for power supply (VBUS), terminal No. 2 for a differential signal (D−), terminal No. 3 for a differential signal (D+), terminal No. 4 for identification (ID), and terminal No. 5 for grounding (GND).

The receptacle 1 is assembled in the following manner. The body 6 with which the contacts 4 are integrally formed is inserted into the metal shell 5 from a rear end opening of the metal shell. Then, the rear surface of the rear wall portion 6a is covered by the rear surface cover 5b, and the body 6 is fixed into the metal shell 5 to complete the assembly.

The receptacle 1 may be mounted in a small portable electronic apparatus such as a smart phone or a tablet terminal, for the purpose of charging or data communication. Specifically, the receptacle is mounted in an edge portion of a printed circuit board which is incorporated together with a secondary battery into a case of the apparatus, and the plug inserting portion 2 is opened in a plug insertion port disposed in a side surface of the case. The receptacle is mounted on the printed circuit board by soldering the solder portions 4b of the contacts 4, and the soldering portions 5a of the metal shell 5 to receptacle connecting portions configured by lands and through holes disposed on the printed circuit board, respectively.

Figure 1:
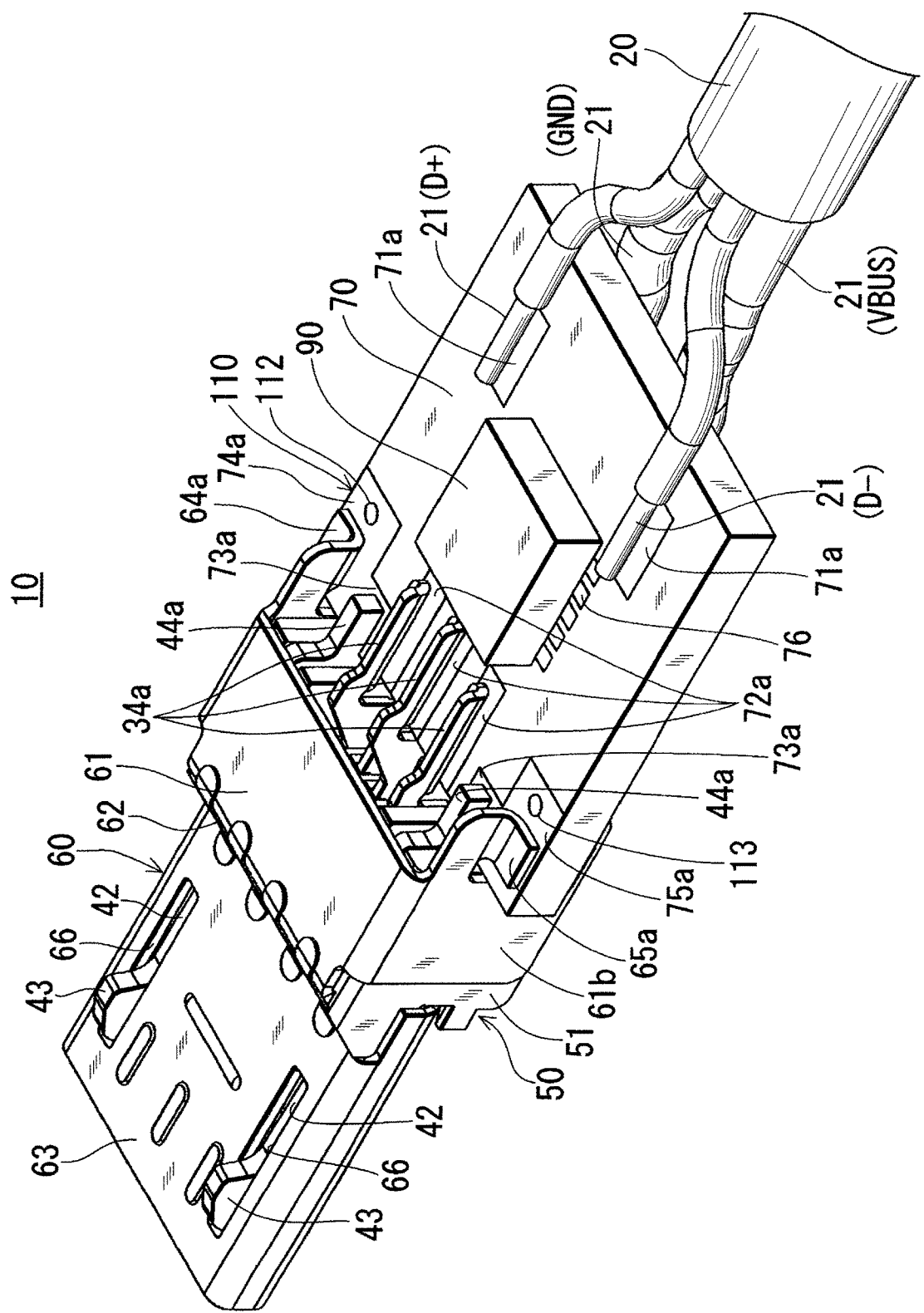
FIG. 1 is a perspective view of a plug connector of Embodiment 1 of the invention.
Figure 2:
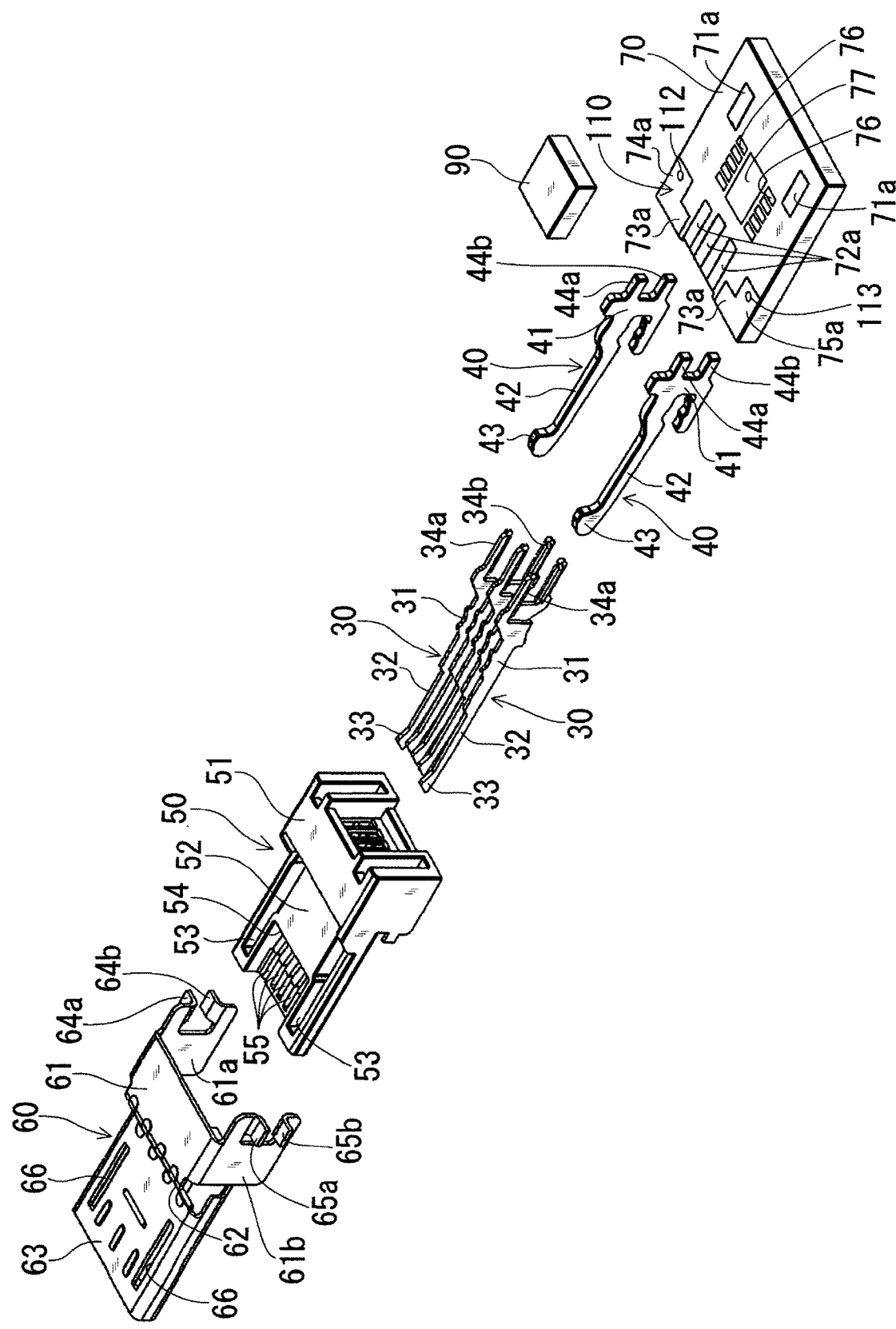
FIG. 2 is an exploded perspective view of the plug connector of Embodiment 1 of the invention.
Figure 3:
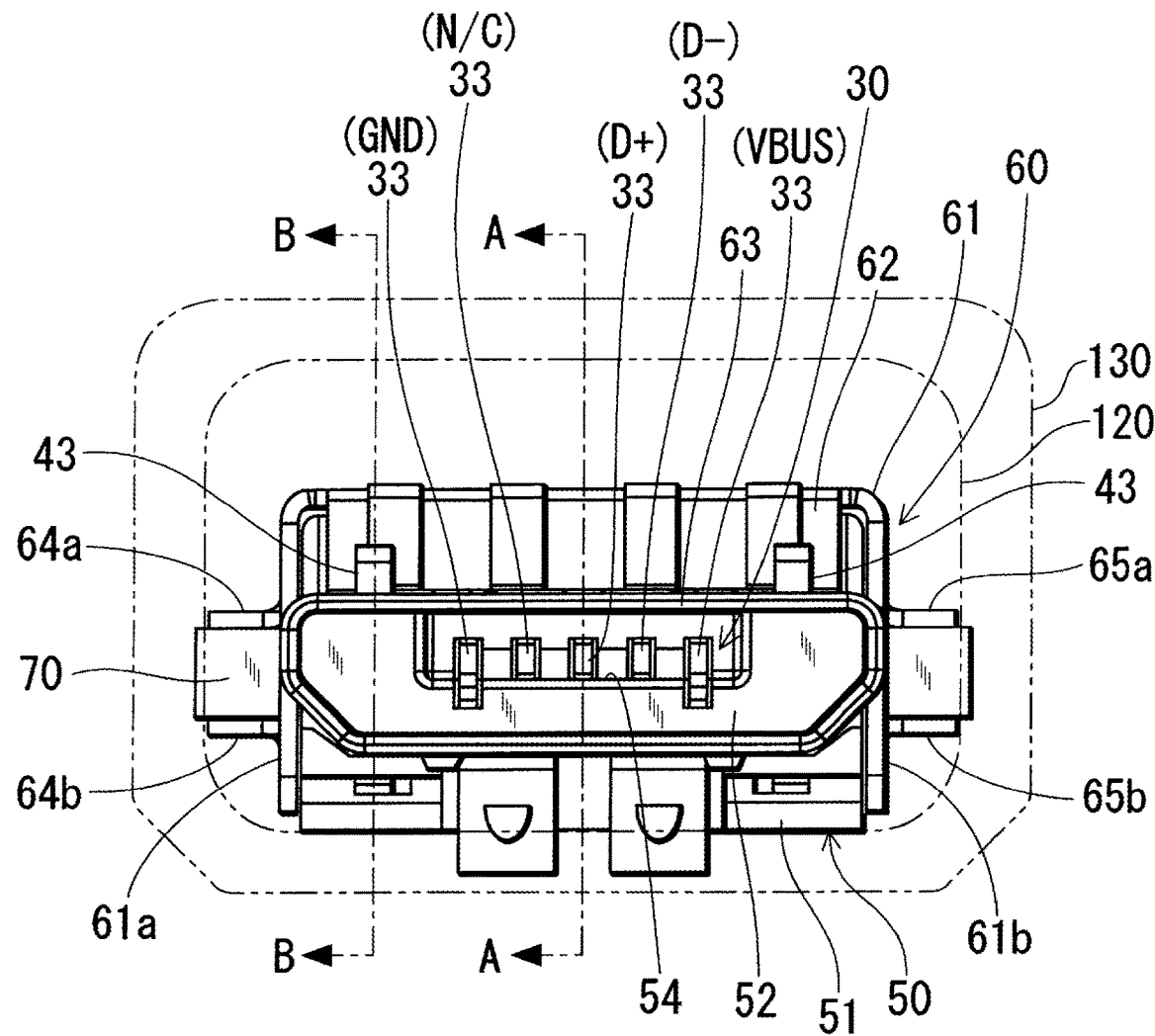
FIG. 3 is a front view of the plug connector of Embodiment 1 of the invention.
Figure 4:
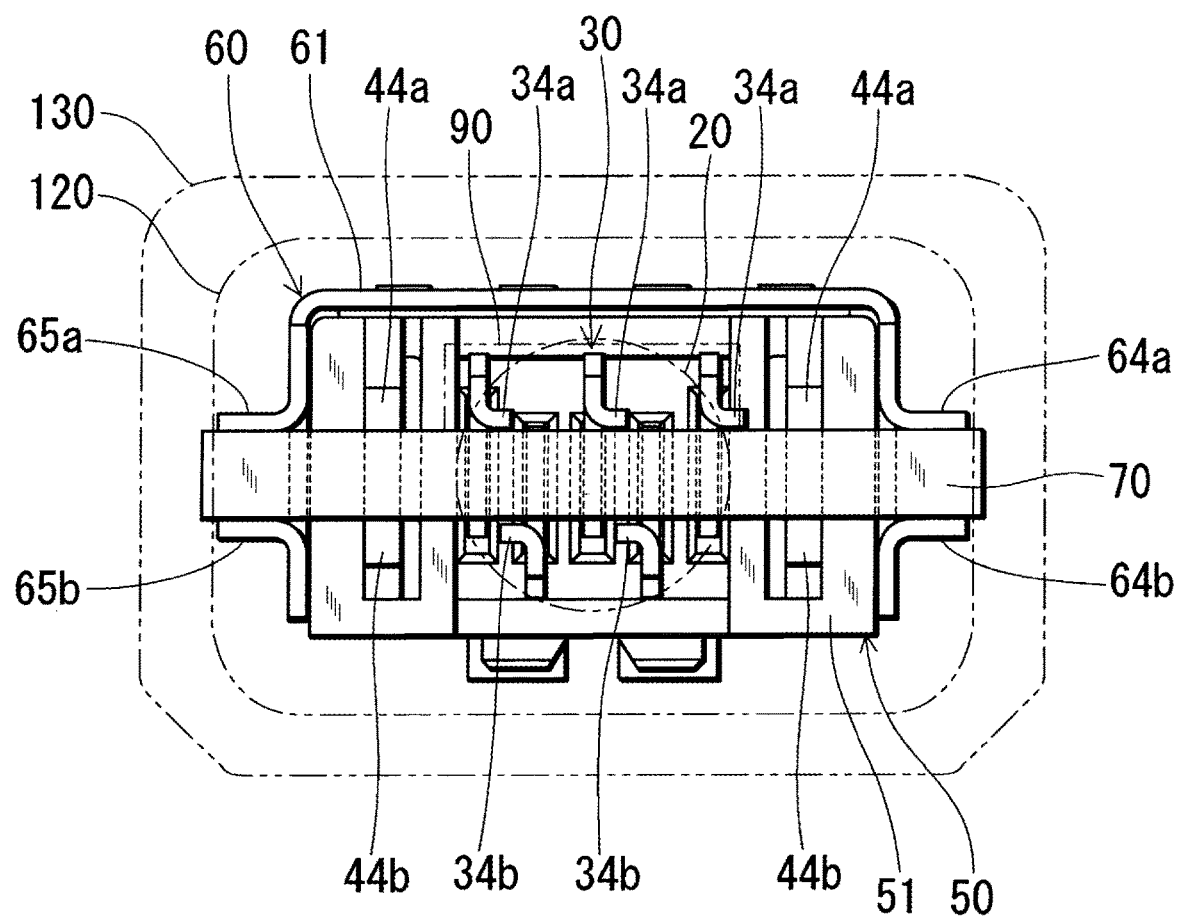
FIG. 4 is a rear view of the plug connector of Embodiment 1 of the invention.
Figure 5:
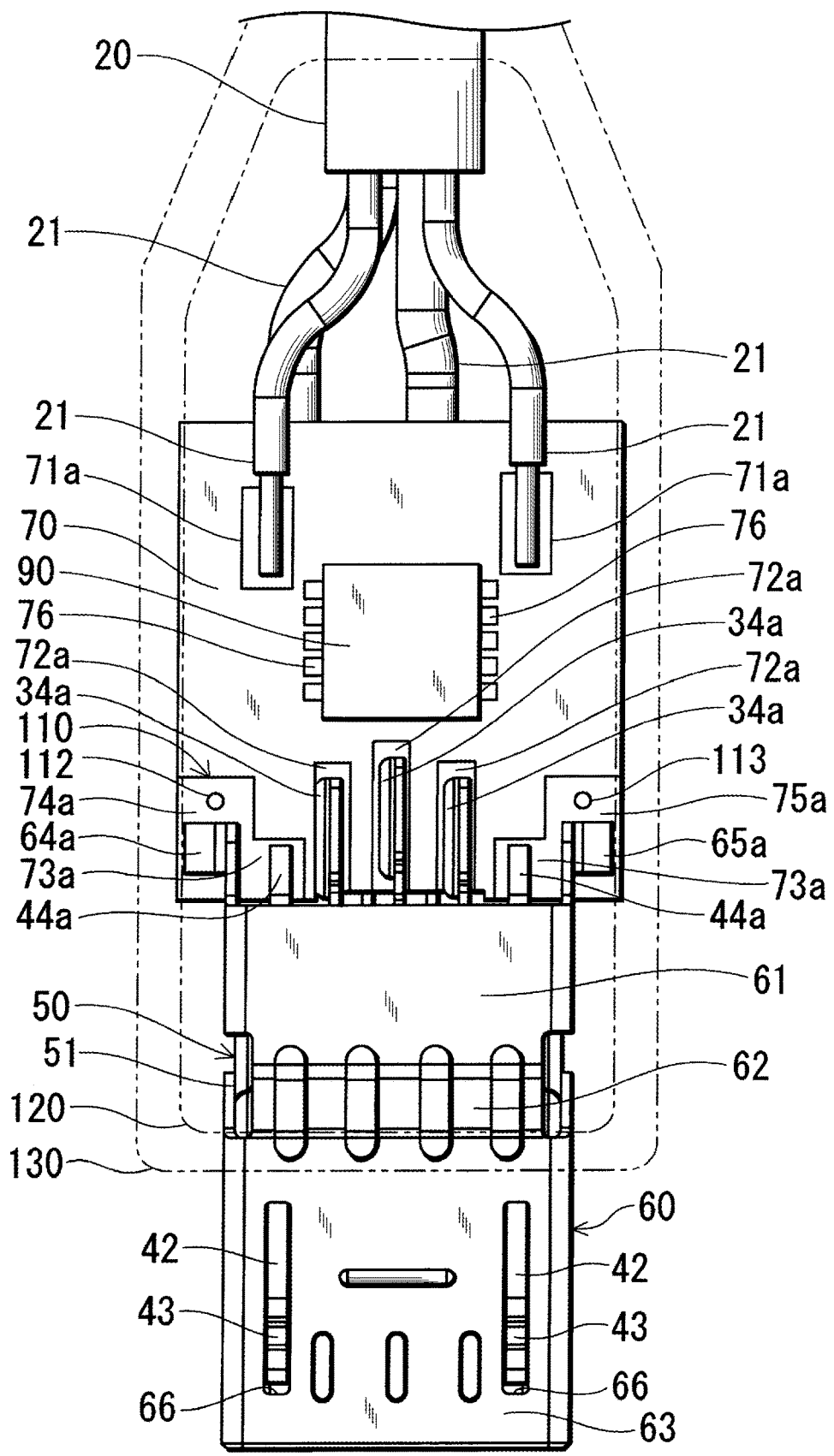
FIG. 5 is a plan view of the plug connector of Embodiment 1 of the invention.
Figure 6:
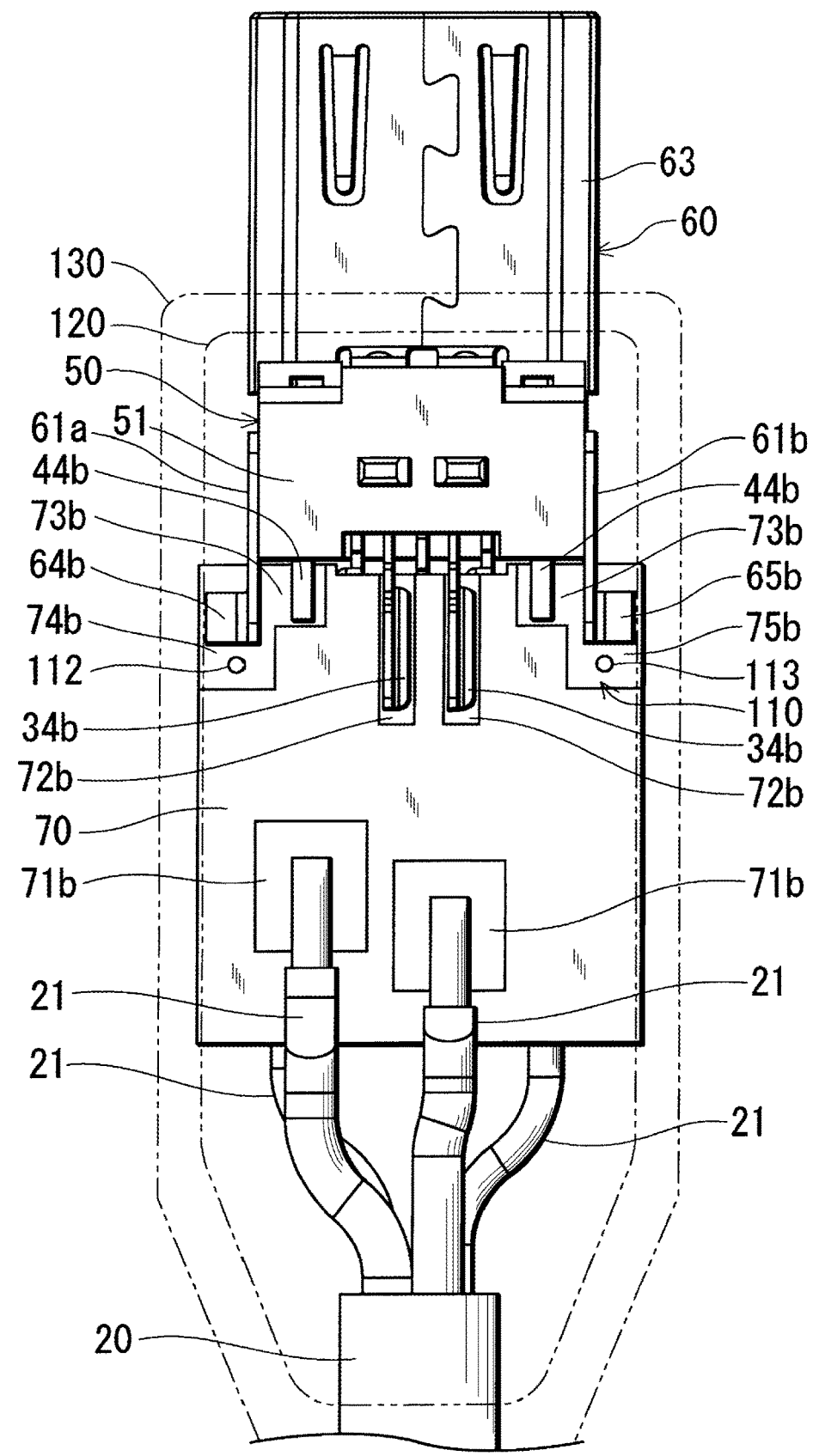
FIG. 6 is a bottom view of the plug connector of Embodiment 1 of the invention.
Figure 7:
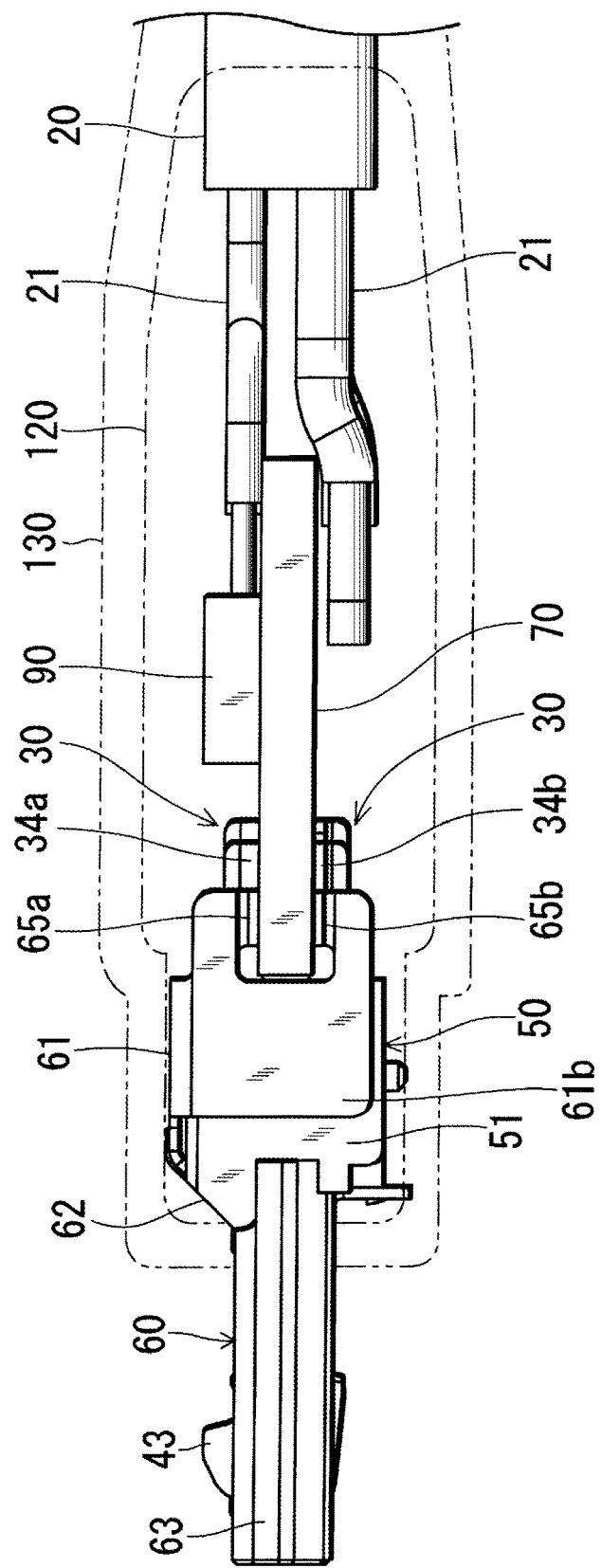
FIG. 7 is a right-side view of the plug connector of Embodiment 1 of the invention.
Figure 8:
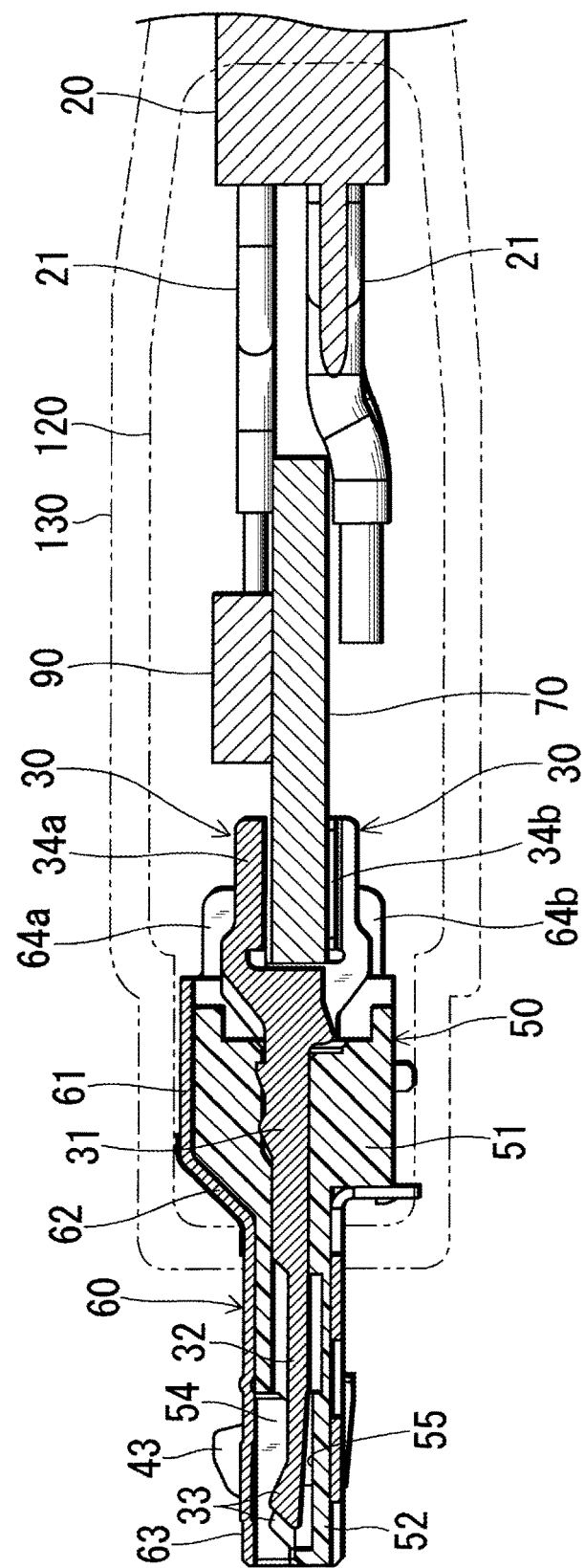
FIG. 8 is a sectional view taken along line A-A in FIG. 3.
Figure 9:
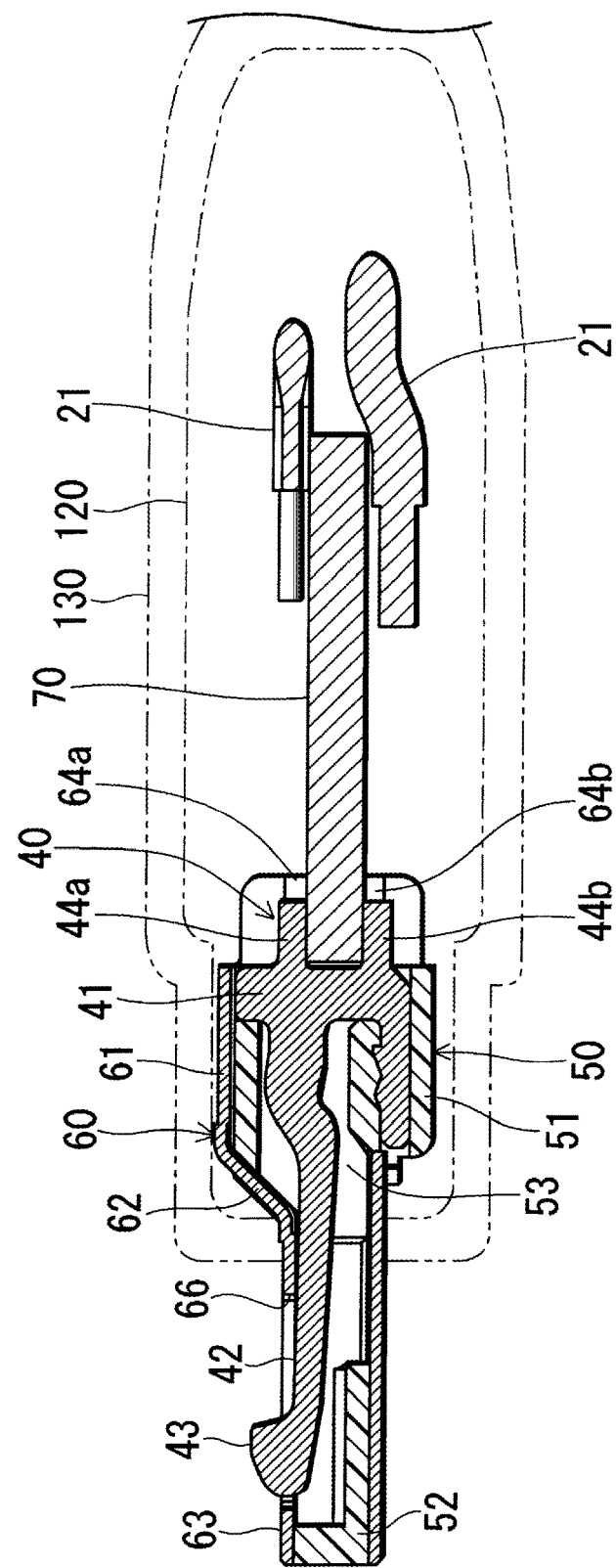
FIG. 9 is a sectional view taken along line B-B in FIG. 3.

Next, the plug 10 will be described with reference to FIGS. 1 to 16. FIG. 1 is a perspective view of the plug 10, FIG. 2 is an exploded perspective view of the plug 10, FIG. 3 is a front view of the plug 10, FIG. 4 is a rear view of the plug 10, FIG. 5 is a plan view of the plug 10, FIG. 6 is a bottom view of the plug 10, FIG. 7 is a right-side view of the plug 10, FIG. 8 is a sectional view taken along line A-A in FIG. 3, and FIG. 9 is a sectional view taken along line B-B in FIG. 3. FIGS. 1 and 2 show the plug 10 in a state where an inner mold 120 and over mold 130 for the plug are made transparent, and FIGS. 3 to 7 show the plug 10 in a state where the inner mold 120 and over mold 130 for the plug are made semi-transparent.

Figure 10:
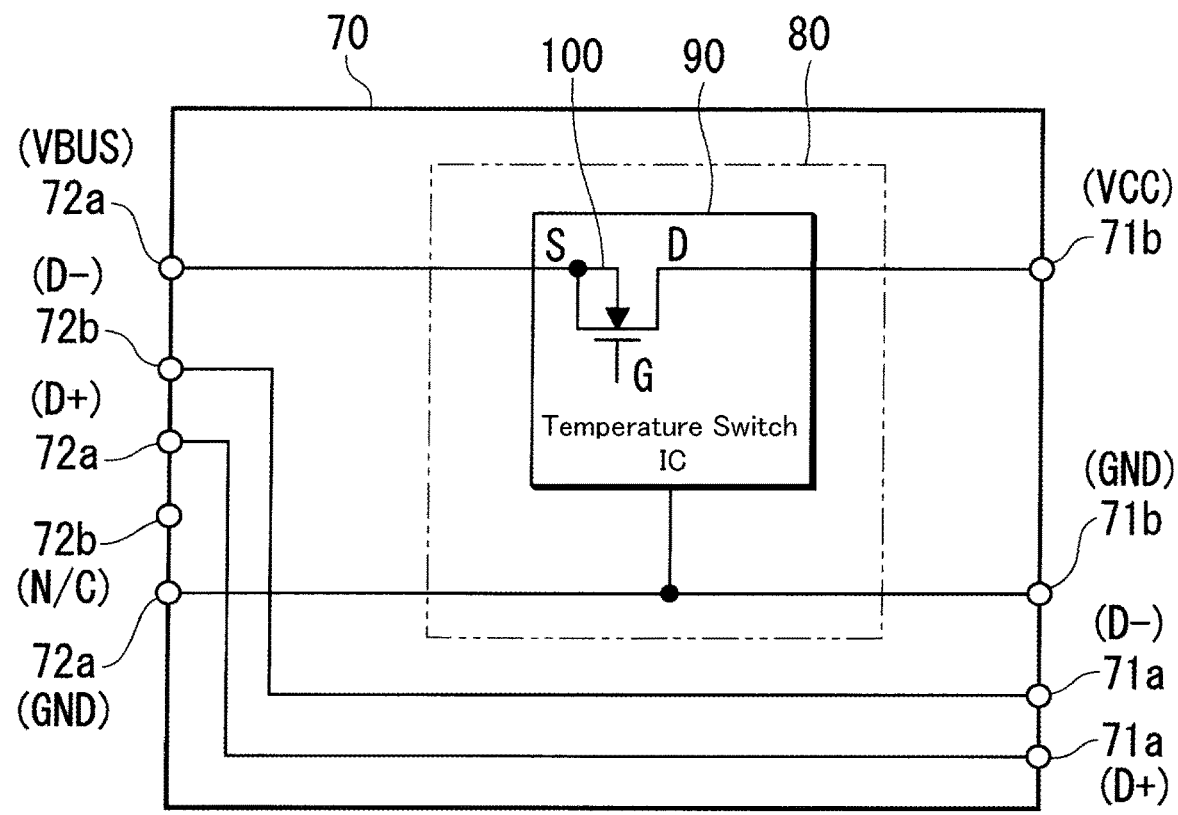
FIG. 10 is a diagram showing a thermal protection circuit of the plug connector of Embodiment 1 of the invention.

As shown in FIGS. 1 to 9, the plug 10 includes: the cable 20; five contacts 30; a pair of latch members 40; an insulative body 50 which holds the contacts 30 and the latch members 40; a metal shell 60 which is a sheet-metal made shield member accommodating the body 50; a printed circuit board (hereinafter, referred to as "board") 70 in which the contacts 30, the latch members 40, and the metal shell 60 are solder-connected to the front end side, and the cable 20 is solder-connected to the rear end side; and a temperature switch IC 90 which is mounted on the board 70 together with a resistor, capacitor, and the like that are not shown, to constitute a thermal protection circuit 80 (see FIG. 10).

As shown in FIGS. 1, 5, and 6, the cable 20 is a USB cable according to the micro-USB (2.0) standard, and includes four core wires 21. In the four core wires 21, one wire is used for power supply (Vcc), one wire is used for grounding (GND), and the remaining two wires are used for the paired differential signals (D−) and (D+). As shown in FIGS. 1 and 5, the two core wires 21 for the differential signals are solder-connected to the upper surface of the board 70. As shown in FIG. 6, the two core wires 21 for power supply (Vcc) and grounding (GND) are solder-connected to the lower surface of the board 70. The cable 20 includes a shield which covers the peripheries of the four core wires 21, and a sheath which covers the periphery of the shield.

As shown in FIGS. 2 and 8, each of the contacts 30 is sheet-metal made, and formed by punching and bending a conductive metal plate which is thinner than the metal shell 60, into a predetermined shape. The contact 30 integrally includes: a fixing portion 31 which is to be fixed to the body 50; an arm portion 32 which forwardly extends from the fixing portion 31, and which is vertically and elastically displaceable; a contacting portion 33 which is disposed in the tip end of the arm portion 32, and which is to be contacted with the corresponding contact 4; and either of upper and lower soldering portions 34a, 34b which rearwardly extend from the fixing portion 31, and which is to be solder-connected to the board 70. As shown in FIGS. 1, 4, 5, 7, and 8, the upper soldering portions 34a are soldered to the upper surface of the board 70. As shown in FIGS. 4, 6, 7, and 8, the lower soldering portions 34b are soldered to the lower surface of the board 70.

As shown in FIGS. 2 and 9, each of the latch members 40 is sheet-metal made, and formed by punching and bending a conductive metal plate which is thinner than the metal shell 60, into a predetermined shape. The latch member 40 integrally includes: a fixing portion 41 which is to be fixed to the body 50; an arm portion 42 which forwardly extends from the fixing portion 41, and which is vertically and elastically displaceable; an engaging portion 43 which is disposed in the tip end of the arm portion 42, and which is to be engaged with the receptacle 1; and both upper and lower soldering portions 44a, 44b which rearwardly extend from the fixing portion 41, and which is to be solder-connected to the board 70. As shown in FIGS. 1, 4, 5, and 9, the upper soldering portions 44a are soldered to the upper surface of the board 70. As shown in FIGS. 4, 6, and 9, the lower soldering portions 44b are soldered to the lower surface of the board 70.

As shown in FIGS. 1 to 9, the body 50 is formed by molding an insulating synthetic resin material. The body 50 integrally includes a rectangular parallelepiped basal portion 51, and a fitting portion 52 which is to be inserted into the receptacle 1, specifically, the housing 3, i.e., the plug inserting portion 2.

The fitting portion 52 is projected from a vertically middle portion of the front surface of the basal portion 51, toward the front side in the direction in which the fitting portion is inserted into the receptacle 1, and formed into a rectangular planar shape which is thinner than the basal portion 51, and which is equal in width to the basal portion 51.

As shown in FIGS. 2, 4, and 9, a pair of latch member holding grooves 53 are formed in lateral end portions of the body 50, respectively. Each of the latch member holding grooves 53 longitudinally extends in both the basal portion and the fitting portion 52. The front portion of the groove is opened in the upper surface of the fitting portion 52, and the rear end of the groove is opened in the rear surface of the basal portion 51.

As shown in FIGS. 2, 3, and 8, the fitting portion 52 which is between the latch member holding grooves 53 includes a counter-contact insertion portion 54 into which the contact supporting portion 6b is inserted in accordance with the insertion of the fitting portion 52 into the receptacle 1. The counter-contact insertion portion 54 is formed into a recessed shape which is opened upwardly and forwardly.

As shown in FIGS. 2 to 4 and 8, five contact holding grooves 55 which are juxtaposed at predetermined intervals in the width direction of the body 50 are formed between the latch member holding grooves 53. Each of the contact holding grooves 55 longitudinally extends in both the basal portion and the fitting portion 52. The front portion of the groove is opened in the counter-contact insertion portion 54, and the rear end of the groove is opened in the rear surface of the basal portion 51.

As shown in FIGS. 1, 3, 4 to 6, and 9, the latch members 40 are inserted from the rear side of the basal portion 51 into the latch member holding grooves 53, respectively, whereby the latch members are held in the width end portions of the body 50. In each of the latch members in the held state, the fixing portion 41 is pressingly inserted and fixed into the basal portion 51, the arm portion 42 is inserted into the fitting portion 52 so as to be vertically and elastically displaceable, the engaging portion 43 which is provided in the front end of the latch member 40 is projected from the upper surface of the fitting portion 52, and the upper and lower soldering portions 44a, 44b which are provided in the rear end of the latch member 40 are rearwardly projected from the rear surface of the basal portion 51.

As shown in FIGS. 1, 3, and 4 to 8, the contacts 30 are inserted from the rear side of the basal portion 51 into the respective contact holding grooves 55, whereby the contacts are held juxtaposedly at the predetermined intervals in the with direction of the body 50 between the latch members 40. In each of the contacts in the held state, the fixing portion 31 is pressingly inserted and fixed into the basal portion 51, the arm portion 32 is inserted into the fitting portion 52 so as to be vertically and elastically displaceable, the contact portion 33 which is provided in the front end of the contact 30 is projected into the counter-contact insertion portion 54, and the upper soldering portion 34a or lower soldering portion 34b which is provided in the rear end of the contact 30 is rearwardly projected from the rear surface of the basal portion 51.

The contacts 30 are arranged laterally in a row in the sequence of, from the right side toward the left side in FIG. 3, terminal No. 1 for power supply (VBUS), terminal No. 2 for the differential signal (D−), terminal No. 3 for the differential signal (D+), terminal No. 4 for identification (ID), and terminal No. 5 for grounding (GND). As shown in FIGS. 1, 2, 4, and 5, each of only the three contacts 30, i.e., terminal No. 1 for power supply (VBUS), terminal No. 3 for the differential signal (D+), and terminal No. 5 for grounding (GND) includes the upper soldering portion 34a. As shown in FIGS. 2, 4, and 6, only each of the two contacts 30, i.e., terminal No. 2 for the differential signal (D−) and terminal No. 4 for identification (ID) includes the lower soldering portions 34b.

As shown in FIGS. 1 to 9, the metal shell 60 is sheet-metal made, and formed by punching and bending a conductive metal plate into a predetermined shape. The metal shell 60 integrally includes: a first shell portion 61 which covers the upper and right and left side surfaces of the basal portion 51, and which has a downwardly directed U-like shape; a second shell portion 62 which covers the inclined step surface configured by the upper surfaces of the basal portion 51 and the fitting portion 52; a third shell portion 63 which covers the whole outer circumference of the fitting portion 52, and which has a tubular shape; upper left and lower left soldering portions 64a, 64b which rearwardly elongate from a left side piece portion 61a of the first shell portion 61 that covers the left side surface of the basal portion 51, to be rearwardly projected from the rear surface of the basal portion 51, and which are to be soldered to the board 70; and upper right and lower right soldering portions 65a, 65b which rearwardly elongates from a right side piece portion 61b of the first shell portion 61 that covers the right side surface of the basal portion 51, to be rearwardly projected from the rear surface of the basal portion 51, and which are to be soldered to the board 70.

As shown in FIGS. 3 and 8, the whole outer circumference of the fitting portion 52 is covered by the third shell portion 63, thereby attaining a state where the counter-contact insertion portion 54 is opened only in the forward direction. As shown in FIGS. 1 and 5, a pair of latch holes 66 through which the engaging portions 43 of the latch members 40 are respectively projected are formed in the third shell portion 63.

As shown in FIGS. 1, 4, 5, and 7, the upper left and upper right soldering portions 64a, 65a are soldering portions for the upper surface of the board 70. Between the upper left and upper right soldering portions 64a, 65a of the metal shell 60, the upper soldering portions 34a, 44a which are soldering portions of the contacts 30 and the upper surface of the board 70 of the latch members 40 are juxtaposed in a row.

As shown in FIGS. 4, 6, and 7, the lower left and lower right soldering portions 64b, 65b are soldering portions for the lower surface of the board 70. Between the lower left and lower right soldering portions 64b, 65b of the metal shell 60, the lower soldering portions 34b, 44b which are soldering portions of the contacts 30 and the lower surface of the board 70 of the latch members 40 are juxtaposed in a row.

As shown in FIGS. 4 and 7, one row of the upper soldering portions 34a, 44a, 64a, 65a for the upper surface of the board 70, and one row of the lower soldering portions 34b, 44b, 64b, 65b for the lower surface of the board 70 are arranged to form upper and lower rows on the rear surface side of the basal portion 51.

As shown in FIGS. 1 to 9, the board 70 is formed into a rectangular shape which is wider than the fitting portion 52. In a state where the front end portion of the board 70 is inserted between the upper soldering portions 34a, 44a, 64a, 65a of the upper row, and the lower soldering portions 34b, 44b, 64b, 65b of the lower row, the upper soldering portions 34a, 44a, 64a, 65a of the upper row are solder-connected to the upper surface of the front end portion of the board 70, and the lower soldering portions 34b, 44b, 64b, 65b of the lower row are solder-connected to the lower surface of the front end portion of the board 70, whereby the board 70 is supported in a state where the board is projected from a vertically middle portion of the rear surface of the basal portion 51, toward the rear side in the insertion direction of the receptacle 1.

As shown in FIGS. 1, 2, and 5, the upper surface of the board 70 includes: two cable connection lands 71a to which conductors of two core wires 21 for the differential signals (D−) and (D+) in the cable 20 are solder-connected; three contact connection lands 72a to which the upper soldering portions 34a of the three contacts 30 for power supply (VBUS), the differential signal (D+), and grounding (GND) are solder-connected; two latch member connection lands 73a to which the upper soldering portions 44a of the pair of latch members 40 are solder-connected; left and right shell connection lands 74a, 75a to which the upper left and upper right soldering portions 64a, 65a of the metal shell 60 are solder-connected; temperature switch IC connection lands 76 to which a plurality of electrode pads 91 (see FIG. 11A) that are exposed and juxtaposed on two edges of two opposed side surfaces and the lower surface of the temperature switch IC 90 are solder-connected; and a temperature switch IC connection land 77 to which a heat sink pad 92 (see FIG. 11A) that is exposed and disposed on the lower surface of the temperature switch IC 90 is solder-connected.

The temperature switch IC connection lands 76, 77 are disposed in the middle portion of the upper surface of the board 70. The cable connection lands 71a are disposed in the rear portion of the upper surface of the board 70. The contact connection lands 72a, the latch member connection lands 73a, and the shell connection lands 74a, 75a are disposed in the front portion of the upper surface of the board 70. The left and right shell connection lands 74a, 75a are disposed in corner portions of the front end of the upper surface of the board 70, the two latch member connection lands 73a are disposed inside the left and right shell connection lands 74a, 75a, and the three contact connection lands 72a are juxtaposed at predetermined intervals in the width direction of the board 70, between the two latch member connection lands 73a. The left shell connection land 74a and the one latch member connection land 73a which is inside the left shell connection land, and the right shell connection land 75a and the one latch member connection land 73a which is inside the right shell connection land are integrated into one connection land, respectively. Alternatively, these connection lands may be individually formed as separate connection lands.

As shown in FIG. 6, the lower surface of the board 70 includes: two cable connection lands 71b to which conductors of two core wires 21 for power supply (Vcc), and grounding (GND) in the cable 20 are solder-connected; two contact connection lands 72b to which the lower soldering portions 34b of the two contacts 30 for the differential signal (D−) and identification (ID) are solder-connected; two latch member connection lands 73b to which the lower soldering portions 44b of the pair of latch members 40 are solder-connected; and left and right shell connection lands 74b, 75b to which the lower left and lower right soldering portions 64b, 65b of the metal shell 60 are solder-connected.

The cable connection lands 71b are disposed in the rear portion of the lower surface of the board 70. The contact connection lands 72b, the latch member connection lands 73b, and the left and right shell connection lands 74b, 75b are disposed in a front portion of the lower surface of the board 70. The left and right shell connection lands 74b, 75b are disposed in corner portions of the front end of the lower surface of the board 70, the two latch member connection lands 73b are disposed inside the left and right shell connection lands 74b, 75b, and the two contact connection lands 72b are juxtaposed at predetermined intervals in the width direction of the board 70, between the two latch member connection lands 73b. The left shell connection land 74b and the one latch member connection land 73b which is inside the left shell connection land, and the right shell connection land 75b and the one latch member connection land 73b which is inside the right shell connection land are integrated into one connection land, respectively. Alternatively, these connection lands may be individually formed as separate connection lands.

Next, the thermal protection circuit 80 which is mounted on the board 70 of the plug 10 will be described with reference to FIG. 10. FIG. 10 is a diagram showing the thermal protection circuit 80 of the plug 10.

In the board 70, the four contact connection lands 72a, 72b other than the land for identification (ID), and the four cable connection lands 71a, 71b corresponding to the contact connection lands are connected to each other, respectively, and the four contacts 30 other than the contact for identification (ID), and four core wires 21 corresponding to the contacts are electrically connected to each other, respectively. The contact connection land 72b for identification (ID) is not connected to any terminal, and the contact 30 for identification (ID) is set as an idle terminal (N/C: Not Connected).

The thermal protection circuit 80 detects abnormal heating of the plug 10, cuts off a current supply, and include the temperature switch IC 90 which detects the temperature, and an N-channel FET (Field Effect Transistor) 100 which is incorporated in the temperature switch IC 90. The electrode pads 91 which are disposed on the lower surface of the temperature switch IC 90 are connected to the temperature switch IC connection lands 76 which are disposed on the upper surface of the board 70, through solder 93, and the heat sink pad 92 which is disposed on the lower surface of the temperature switch IC 90 is connected to the temperature switch IC connection land 77 which is disposed on the upper surface of the board 70, through solder 93. According to the configuration, the temperature switch IC 90 is surface-mounted on the board 70 (see FIGS. 11A to 12).

The cable connection land 71b for power supply (Vcc) is connected to the drain (D) of the FET 100. The contact connection land 72a for power supply (VBUS) is connected to the source (S) of the FET 100. Namely, the FET 100 is inserted into a power supply wiring of the board 70 through which the cable connection land 71b for power supply (Vcc) and the cable connection land 72a for power supply (VBUS) are connected to each other.

The temperature switch IC 90 detects the temperature by means of a temperature sensor which is incorporated in the temperature switch IC. For example, a thermistor (resistive element), a temperature sensor IC (semiconductor devices such as transistors and diodes), or the like may be used as the temperature sensor. In the temperature switch IC 90, when a temperature sensor portion detects a predetermined temperature (temperature corresponding to abnormal heating to be detected: for example, 100° C.), the FET 100 is turned OFF. The cable connection land 71b for power supply (Vcc) is connected to the power-supply electrode pad 91 of the temperature switch IC 90. The cable connection land 71b for grounding (GND) is connected to the grounding electrode pad 91 of the temperature switch IC 90.

Figure 11A:
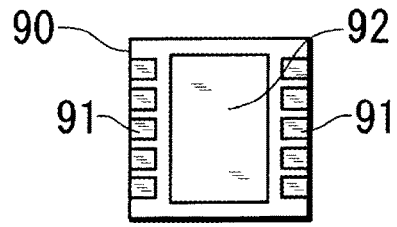
FIGS. 11A to 11D are views showing a heat conduction pattern of the plug connector of Embodiment 1 of the invention.
Figure 11B:
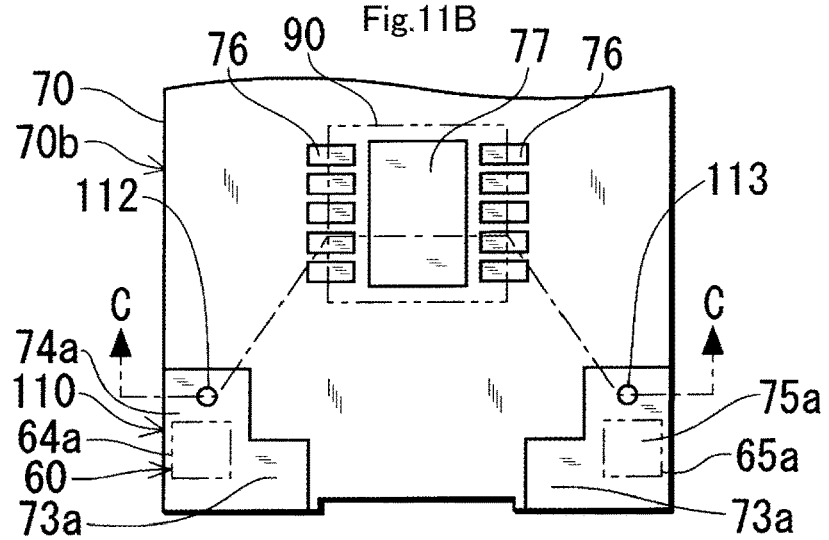
Figure 11C:
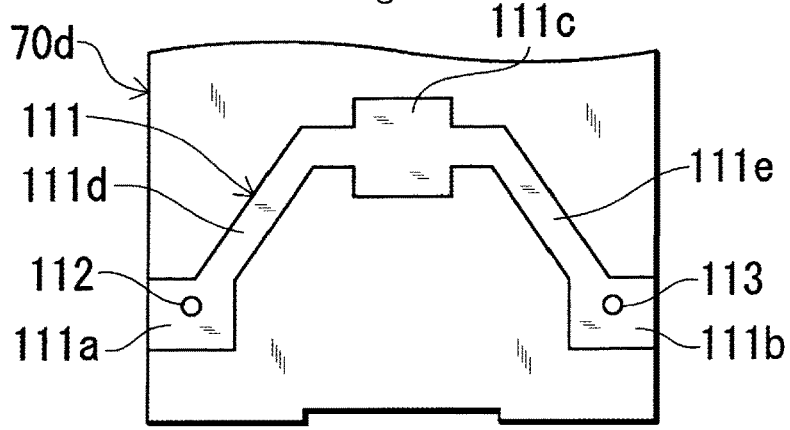
Figure 11D:
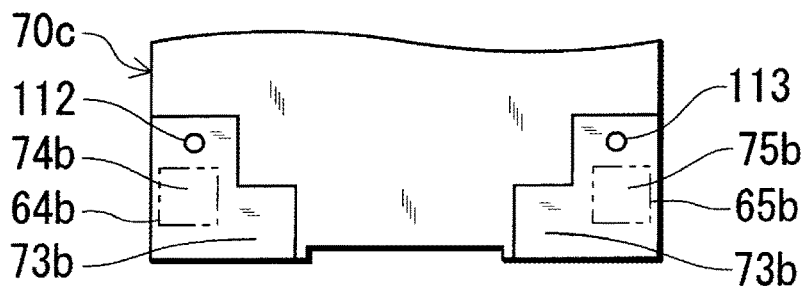
Figure 12:
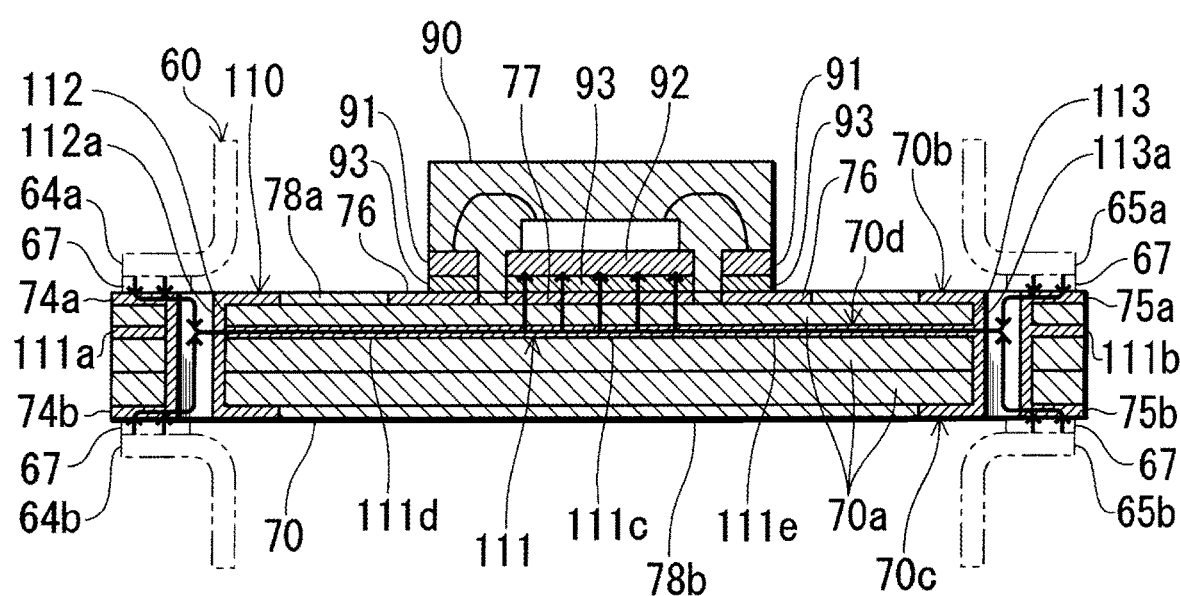
FIG. 12 is a sectional view taken along line C-C in FIG. 11B.

Next, a heat conduction pattern 110 disposed in the board 70 of the plug 10 will be described with reference to FIGS. 11A to 11D and 12. FIGS. 11A to 11D are views showing the heat conduction pattern 110 of the plug 10, FIG. 11A is a bottom view of the temperature switch IC 90, FIG. 11B is a plan view of the heat conduction pattern 110 included in the surface layer 70b of the upper surface of the board 70, FIG. 11C is a plan view of the heat conduction pattern 110 included in the inner layer 70d of the board 70, and FIG. 11D is a plan view of the heat conduction pattern 110 included in the surface layer 70c of the lower surface of the board 70. FIG. 12 is a sectional view taken along line C-C in FIG. 11B.

The board 70 is a multi-layer board in which, for example, three insulating layers 70a and four conductor layers are stacked. As the insulating layers 70a, layers in which glass woven cloth is impregnated with an epoxy resin are used. Each of the conductor layers is configured by an electrically conductive material such as copper foil. The connection lands 71a, 72a, 73a, 74a, 75a, 76, 77 are formed as a conductor layer on the upper surface of the board 70, i.e., parts of the one surface layer (outer layer) 70b of the board 70. In the upper surface of the board 70, the area other than the connection lands 71a, 72a, 73a, 74a, 75a, 76, 77 is covered by a solder resist 78a. The connection lands 71b, 72b, 73b, 74b, 75b are formed as a conductor layer on the lower surface of the board 70, i.e., parts of the other surface layer 70c (outer layer) of the board 70. In the lower surface of the board 70, the area other than the connection lands 71b, 72b, 73b, 74b, 75b is covered by a solder resist 78b.

The board 70 includes the heat conduction pattern 110. The heat conduction pattern 110 conducts heat of the metal shell 60 to the temperature switch IC 90. Specifically, the heat conduction pattern 110 includes a portion which overlaps with the temperature switch IC 90 in the thickness direction of the board 70. Specifically, the heat conduction pattern 110 includes a portion to which the metal shell 60 is solder-connected, and the portion which overlaps with the temperature switch IC 90 in the thickness direction of the board 70. More specifically, the heat conduction pattern 110 includes: the left and right shell connection lands 74a, 75a (see FIGS. 11B and 12) which are disposed on the surface layer 70b of the upper surface of the board 70, and to which the upper left and right soldering portions 64a, 65a disposed on the metal shell 60 are connected through solder 67; the left and right shell connection lands 74b, 75b (see FIGS. 11D and 12) which are disposed on the surface layer 70c of the lower surface of the board 70, and to which the lower left and right soldering portions 64b, 65b disposed on the metal shell 60 are connected through solder 67; an inner-layer conductor pattern 111 (see FIGS. 11C and 12) which is disposed on the inner layer 70d adjacent to the surface layer 70b of the upper surface of the board 70 on which the temperature switch IC 90 is mounted; left and right vias 112, 113 (see FIGS. 11B to 11D and 12) which connect between the left and right shell connection lands 74a, 74b, 75a, 75b and the inner-layer conductor pattern 111; and the temperature switch IC connection land 77 (see FIGS. 11B and 12) which is disposed on the surface layer 70b of the upper surface of the board 70 on which the temperature switch IC 90 is mounted, and to which the heat sink pad 92 that is disposed on the lower surface of the temperature switch IC 90 is connected through the solder 93. The inner-layer conductor pattern 111 includes a portion 111c which overlaps with the temperature switch IC connection land 77 in the thickness direction of the board 70.

As shown in FIGS. 11C and 12, the inner-layer conductor pattern 111 integrally includes: one end portion 111a which is placed between the left shell connection lands 74a, 74b so as to overlap with the left shell connection lands 74a, 74b in the thickness direction of the board 70; another end portion 111b which is placed between the right shell connection lands 75a, 75b so as to overlap with the right shell connection lands 75a, 75b in the thickness direction of the board 70; the middle portion 111c which overlaps with the temperature switch IC connection land 77 in the thickness direction of the board 70; a strip-like connecting portion 111d through which the one end portion 111a and the middle portion 111c are connected to each other in a substantially shortest distance; and a strip-like connecting portion 111e through which the other end portion 111b and the middle portion 111c are connected to each other in a substantially shortest distance.

The left via 112 is passed from the left shell connection land 74a on the upper surface of the board 70, through the one end portion 111a of the inner-layer conductor pattern 111, and further passed the whole layers of the board 70 to the left shell connection land 74b on the lower surface of the board 70. On the inner circumferential surface of the left via 112, an inner circumference conductor 112a which is integrated with the left shell connection lands 74a, 74b and the one end portion 111a of the inner-layer conductor pattern 111 is formed by, for example, copper plating.

The right via 113 is passed from the right shell connection land 75a on the upper surface of the board 70, through the other end portion 111b of the inner-layer conductor pattern 111, and further passed the whole layers of the board 70 to the right shell connection land 75b on the lower surface of the board 70. On the inner circumferential surface of the right via 113, an inner circumference conductor 113a which is integrated with the right shell connection lands 75a, 75b and the other end portion 111b of the inner-layer conductor pattern 111 is formed by, for example, copper plating.

Figure 13:
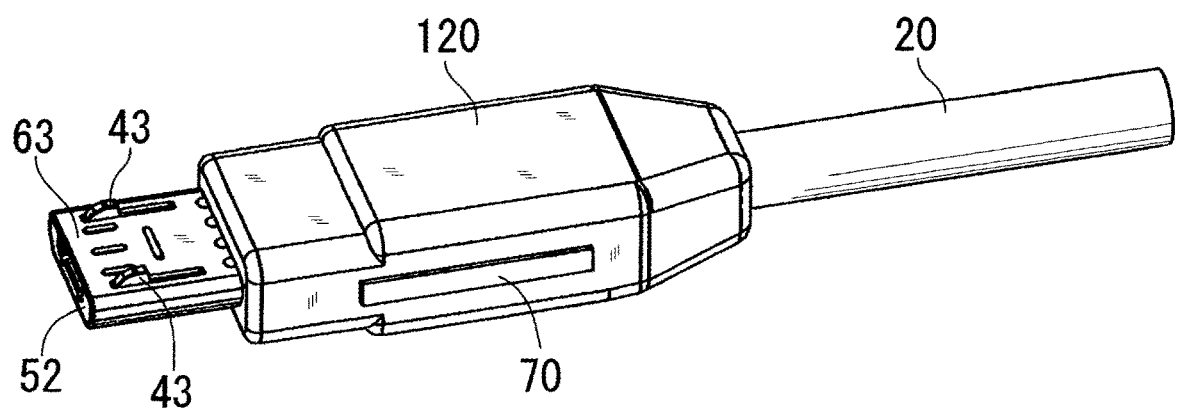
FIG. 13 is a perspective view showing an inner mold of the plug connector of Embodiment 1 of the invention.
Figure 14:
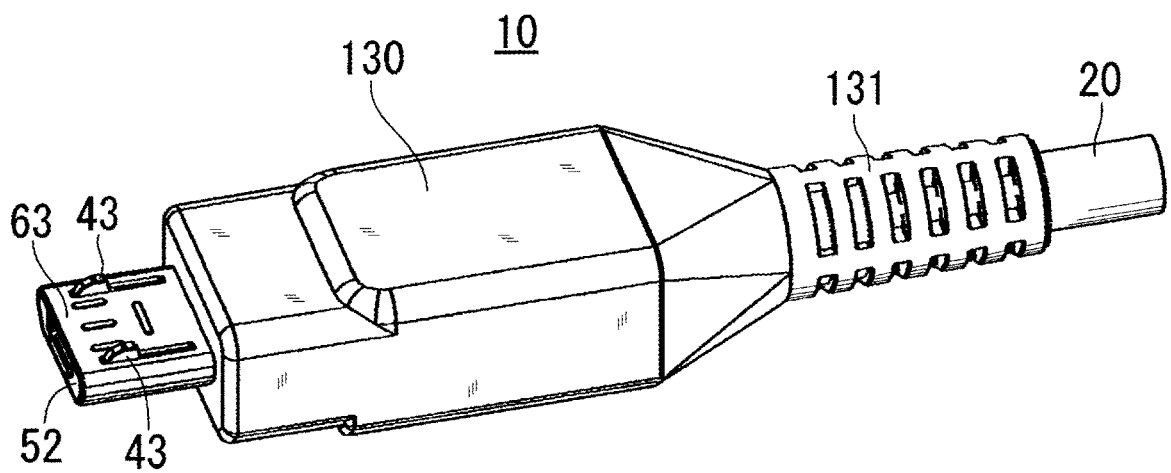
FIG. 14 is a perspective view showing an over mold of the plug connector of Embodiment 1 of the invention.

Next, the inner mold 120 and over mold 130 which are disposed in the plug 10 will be described with reference to FIGS. 13 and 14. FIG. 13 is a perspective view showing the plug 10 in a state where the inner mold 120 is illustrated while only the over mold 130 is made transparent, and FIG. 14 is a perspective view showing the plug 10 in a state where the over mold 130 is illustrated.

As shown in FIG. 13, the inner mold 120 made of an insulating synthetic resin is formed by insert-molding in the peripheries of the basal portion 51 and board 70 of the connector unit shown in FIG. 1, and one end portion of the sheath of the cable 20. As shown in FIG. 14, thereafter, the over mold 130 made of an insulating synthetic resin is formed by insert-molding in the periphery of the inner mold 120, thereby completing the plug 10. In the plug 10, the fitting portion 52 in which the outer circumference is covered by the third shell portion 63 is projected from the front surface middle portion of the over mold 130 toward the front side in the insertion direction of the receptacle 1, and the cable 20 is drawn out to the rear side in the insertion direction of the receptacle 1 through a strain relief 131 which is formed integrally with the rear end of the over mold 130.

In the thus configured plug 10, the connecting portion (handling portion) with the cable 20 which is covered by the over mold 130 is held by the hand, and the fitting portion 52 which is projected from the front surface middle portion of the over mold 130 toward the front side in the insertion direction of the receptacle 1 is inserted into the receptacle 1 mounted in the small portable electronic apparatus such as a smart phone. Then, the contacts 30 are in contact with the contacts 4 inserted into the counter-contact insertion portion 54 to attain electrical connection between the contacts 4 and the core wires 21 of the cable 20. Namely, the cable 20 is electrically connected to the small portable electronic apparatus. When the fitting portion 52 is inserted into the receptacle 1 to form a complete fitting, the latch members 40 cause the engaging portions 43 to be engaged with the latch holes 5c, whereby unintended slipping off of the fitting portion 52 is prevented from occurring, and the plug 10 is fixed (half-locked) to the receptacle 1. The latch members 40 which are held together with the contacts 30 to the body 50 are solder-connected to the board 70. Even when the fitting portion 52 is pried when pulled out from the receptacle 1, therefore, a stress occurring in the solder-connecting portions between the contacts 30 and the board 70 can be reduced. Moreover, each of the latch members 40 includes both the upper soldering portion 44a for the upper surface of the board 70, and the lower soldering portions 44b for the lower surface of the board 70, and therefore a stress occurring in the solder-connecting portions between the contacts 30 and the board 70 can be largely reduced.

In the case where a USB plug according to the USB (2.0) standard is disposed in the other end of the cable 20, and the USB plug is connected to a USB receptacle mounted on a PC, a peripheral apparatus of the PC, or the like, data can be transferred between the small portable electronic apparatus and the PC, a peripheral apparatus of the PC, or the like. In the case where the USB plug is connected to a USB receptacle mounted on a PC or a charger such as an AC adapter or a mobile battery, a charging current can be supplied from the connected power supply to the small portable electronic apparatus.

Next, the operation of the thermal protection circuit 80 will be described.

A situation will be considered in which, in order to charge the small portable electronic apparatus on which the receptacle 1 is mounted, the plug 10 disposed in the one end of the cable 20 is connected to the receptacle 1, the other end of the cable 20 is connected to, for example, the main unit of the AC adapter through the USB connector, and a power supply plug of the AC adapter is connected to an outlet.

[Operation when Plug 10 is in Normal Heating State]

In the case where there is no abnormality in a current supply circuit existing between the power supply (AC 100 V) and a secondary battery incorporated in the small portable electronic apparatus, for example, a current which is about 1 A and 2 A at a peak flows through the plug 10, the plug 10 is in a normal heating state, and the FET 100 incorporated in the temperature switch IC 90 is in the ON state to supply the current to the small portable electronic apparatus.

[Operation when Plug 10 is in Abnormal Heating State]

In the case where any abnormality occurs in the current supply circuit and the current is increased, the plug 10 abnormally generates heat, and, when the detected temperature of the temperature switch IC 90 exceeds the predetermined temperature, the detection output becomes HIGH (power supply voltage level) (abnormal heating signal). When the detection output is HIGH, the FET 100 is in the OFF state to cut off the current supply to the small portable electronic apparatus. Then, the abnormal heating of the plug 10 is ceased. A configuration is preferably employed where, when the detected temperature of the temperature switch IC 90 exceeds the predetermined temperature for a time period which is equal to or longer than a time period determined by the capacitor, the detection output of the temperature switch IC 90 becomes HIGH.

[Operation after Cutting Off]

When abnormal heating of the plug 10 is once detected and the FET 100 incorporated in the temperature switch IC 90 is turned OFF, this state is held (latched) by a flip-flop circuit. Even when the abnormal heating of the plug 10 is once ceased, and the detected temperature of the temperature switch IC 90 becomes lower than the predetermined temperature, therefore, the current supply (charging) is not restarted, and a situation where abnormal heating again occurs is not caused. When the power supply plug of the AC adapter is pulled out from the outlet, and the power supply voltage of the temperature switch IC 90 is equal to or lower than the predetermined voltage level, the latched state of the temperature switch IC 90 is reset. Even when the user extracts and inserts the plug 10 from and into the receptacle 1 to restart the charging while the plug remains to be connected to the power supply, therefore, abnormal heating does not again occur.

Since the thermal protection circuit 80 is placed in the connecting portion (handling portion) with the cable 20, there is a tendency that the sensitivity to abnormal heating occurring in the connecting portion with the cable 20 is high, and that to abnormal heating occurring in the fitting portion 52 which is a connecting portion with the receptacle 1 is low.

The plug 10 has a small size and low strength, and the fitting portion 52 is easily deformed by a prying load or the like. There is a case where, in a state where the plug is not connected (fitted) to the receptacle 1, a protection circuit which is usually incorporated in an output apparatus does not operate, and the fitting portion 52 generates abnormal heating. In the case of abnormal heating in the fitting portion 52, it is necessary to sensitively cut off the current supply.

Figure 15:
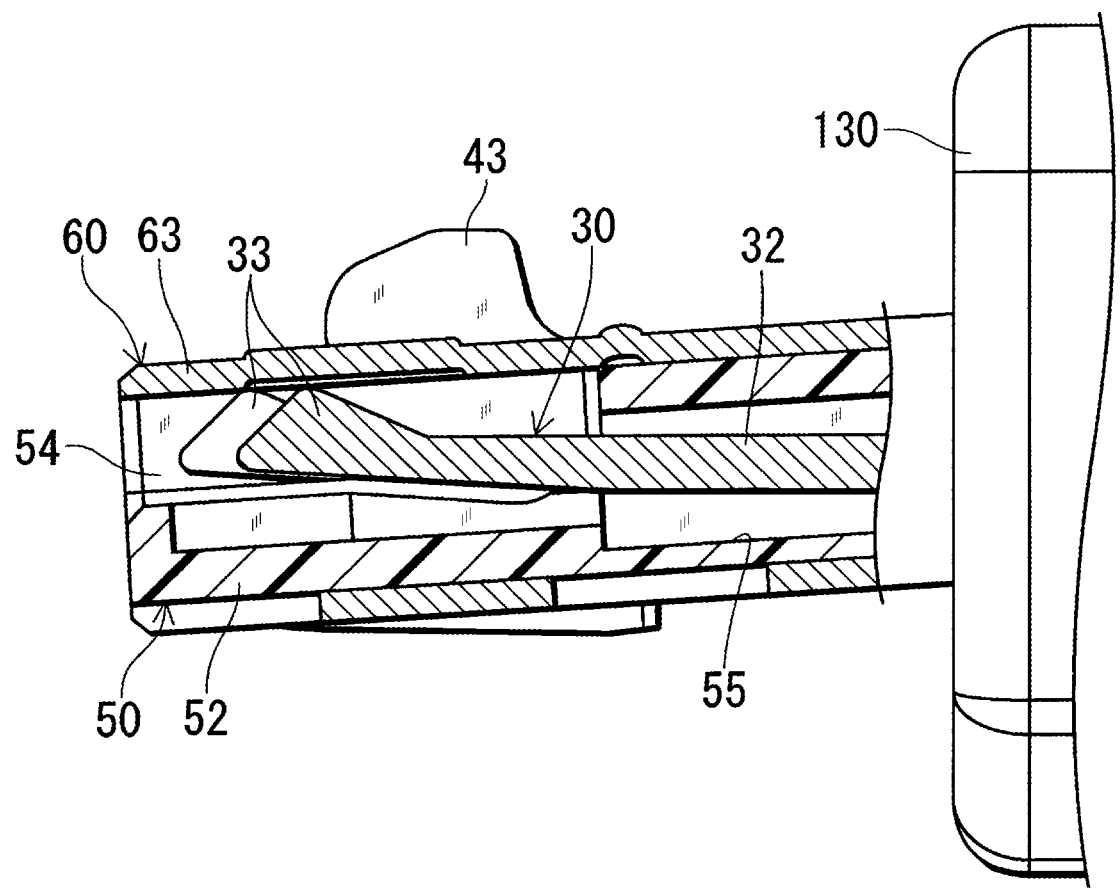
FIG. 15 is a side view, partly in section of a fitting portion of the plug connector of Embodiment 1 of the invention, showing a typical example of abnormal heating in the fitting portion.
Figure 16:
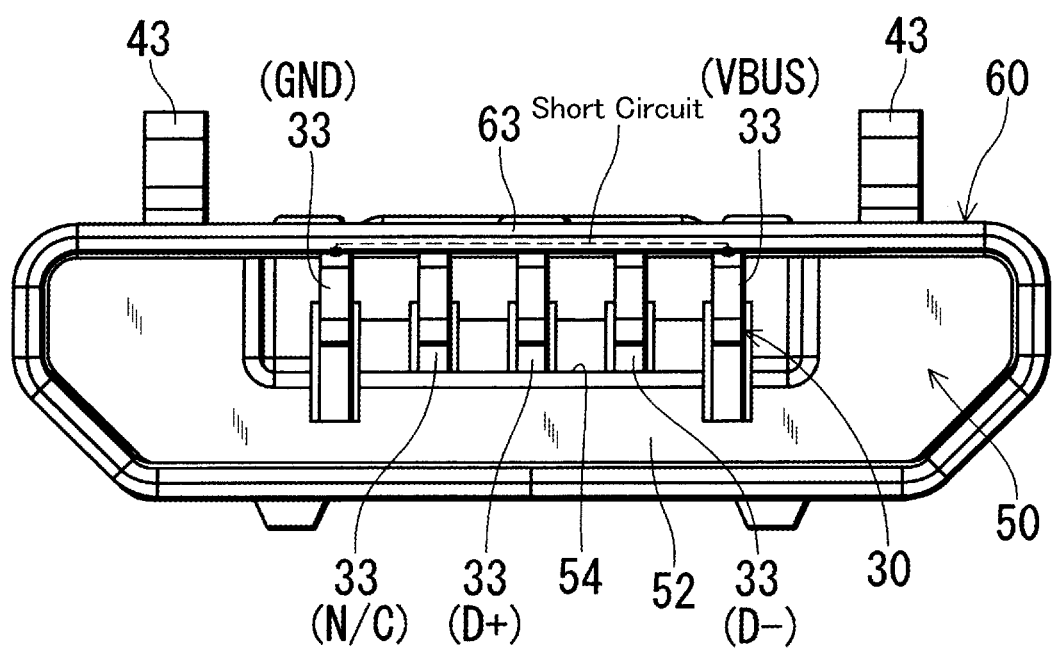
FIG. 16 is a front view showing the typical example of abnormal heating in the fitting portion of the plug connector of Embodiment 1 of the invention.

Next, abnormal heating in the fitting portion 52 of the plug 10 will be described with reference to FIGS. 15 and 16. FIG. 15 is a side view, partly in section of the fitting portion 52 of the plug 10, showing a typical example of abnormal heating in the fitting portion, and FIG. 16 is a front view showing the typical example of abnormal heating in the fitting portion 52 of the plug 10.

Also in this case, a situation will be considered in which, in order to charge the small portable electronic apparatus, the plug 10 disposed in the one end of the cable 20 is connected to the receptacle 1 mounted on the small portable electronic apparatus, the other end of the cable 20 is connected to, for example, the main unit of the AC adapter through the USB connector, and the power supply plug of the AC adapter is connected to the outlet.

a. The plug 10 has a small size and low strength, and the fitting portion 52 is easily deformed by a prying load or the like. The distance between the contacting portions 33 of the contacts 30 which are exposed in the counter-contact insertion portion 54 of the fitting portion 52, and the third shell portion 63 of the metal shell 60 is short. In the case where the fitting portion 52 is deformed, when the fitting portion 52 is pulled out from the receptacle 1, therefore, there is a possibility that, as shown in FIGS. 15 and 16, the contacting portions 33 of the contacts 30 approach the third shell portion 63 to be contacted therewith in a front end portion of the fitting portion 52.

b. The timings of contacts in a above are seldom matched to each other. When, in a state where one of the contacting portions 33 of the two contacts 30 for power supply (VBUS) and grounding (GND) is completely contacted with the third shell portion, the other contacting portion approaches the third shell portion (not completely contacted therewith), an arc is generated between the approaching contacting portion 33 of the contact 30 and the third shell portion 63.

c. Because of the arc, a resistance component is produced in the surface of the metal of the place where the arc is generated. That is, the metal surface is carbonized, and the resistance of the metal surface is increased.

d. When the contacting portions 33 of the two contacts 30 for power supply (VBUS) and grounding (GND) are contacted with the third shell portion 63, both the contacts 30 are short-circuited through the metal shell 60, and an over current flows through the plug 10. However, the protection circuit which is usually incorporated in the AC adapter operates, and the current does not flow as it is.

e. When b and c above are repeated by, for example, continuous use of the plug 10, the carbonization of the metal surface of the place where the arc is generated proceeds, and the resistance of the metal surface is gradually increased. When the resistance exceeds a certain value, the two contacts for power supply (VBUS) and grounding (GND) are short-circuited through the metal shell 60. In this case, even when a current flows through the plug 10, the protection circuit which is incorporated in the AC adapter does not operate because the resistance of the metal surface of the place where the arc is generated is high. Therefore, the current flows as it is, and the front end portion of the fitting portion 52 abnormally generates heat.

Next, the function of the heat conduction pattern 110 will be described.

The abnormal heating occurring in the front end portion of the fitting portion 52 is conducted from the third shell portion 63 which is a cover for the fitting portion 52, to the first shell portion 61 through the second shell portion 62, and then to the soldering portions 64a, 64b, 65a, 65b in the rear end portion of the metal shell 60.

As indicated by the arrows in FIG. 12, the heat conduction pattern 110 conducts the heat conducted to the soldering portions 64a, 64b, 65a, 65b in the rear end portion of the metal shell 60, to the left and right shell connection lands 74a, 75a, 74b, 75b through the solder 67, then to the one end portion 111a and other end portion 111b of the inner-layer conductor pattern 111 through the left and right via 112, 113, then to the temperature switch IC connection land 77 from the middle portion 111c of the inner-layer conductor pattern 111 through the upper insulating layer 70a of the board 70, and finally to the heat sink pad 92 on the lower surface of the temperature switch IC 90 from the temperature switch IC connection land 77 through the solder 93.

[Function and Effect]

As described above, according to the plug 10 of the embodiment, the board 70 includes the heat conduction pattern 110 which conducts heat of the metal shell 60 to the temperature switch IC 90. Specifically, the heat conduction pattern 110 includes the portion which overlaps with the temperature switch IC 90 in the thickness direction of the board 70. The heat conduction pattern 110 further includes the portion to which the metal shell 60 is solder-connected, and the portion which overlaps with the temperature switch IC 90 in the thickness direction of the board 70. More specifically, the board 70 is a multi-layer board, the temperature switch IC is surface-mounted on the board 70, the heat conduction pattern 110 is disposed on the surface layer 70b of the upper surface of the board 70, and includes: the left and right shell connection lands 74a, 75a (see FIGS. 11B and 12) which are disposed on the surface layer 70b of the upper surface of the board 70, and to which the upper left and right soldering portions 64a, 65a disposed on the metal shell 60 are connected through the solder 67; the left and right shell connection lands 74b, 75b (see FIGS. 11D and 12) which are disposed on the surface layer 70c of the lower surface of the board 70, and to which the lower left and right soldering portions 64b, 65b disposed on the metal shell 60 are connected through the solder 67; the inner-layer conductor pattern 111 (see FIGS. 11C and 12) which is disposed on the inner layer 70d adjacent to the surface layer 70b of the upper surface of the board 70 on which the temperature switch IC 90 is mounted; the left and right vias 112, 113 (see FIGS. 11B to 11D and 12) which connect between the left and right shell connection lands 74a, 74b, 75a, 75b and the inner-layer conductor pattern 111; and the temperature switch IC connection land 77 (see FIGS. 11B and 12) which is disposed on the surface layer 70b of the upper surface of the board 70 on which the temperature switch IC 90 is mounted, and to which the heat sink pad 92 that is disposed on the lower surface of the temperature switch IC 90 is connected through the solder 93, the inner-layer conductor pattern 111 includes the portion 111c which overlaps with the temperature switch IC connection land 77 in the thickness direction of the board 70, and therefore the current supply can be cut off with high sensitivity to abnormal heating occurring in the fitting portion 52 with the receptacle 1.

Moreover, the board 70 is used as the member through which heat is conducted from the metal shell 60 to the temperature switch IC 90. Therefore, it is not necessary to additionally dispose a heat conductive member.

The embodiment includes the plurality of soldering portions 64a, 65a, 64b, 65b as the portions which are soldered to the heat conduction pattern 110 of the metal shell 60, and the plurality of shell connection lands 74a, 74b, 75a, 75b as the shell connection lands of the heat conduction pattern 110. Alternatively, these portions and lands may be configured as a single portion and a single land, respectively, and heat of the metal shell 60 is conducted to the heat conduction pattern 110. From a viewpoint that heat of the metal shell 60 is efficiently conducted to the heat conduction pattern 110, however, it is preferable that a plurality of portions which are soldered to the heat conduction pattern 110 of the metal shell 60, and a plurality of shell connection lands of the heat conduction pattern 110 are disposed so that relatively large contact areas are ensured. From another viewpoint that a stress occurring in the solder-connecting portion between the contacts 30 and the board 70 is reduced in a similar manner as the latch members 40, it is preferable that the upper soldering portions 64a, 65a for the upper surface of the board 70, and the lower soldering portions 64b, 65b for the lower surface of the board 70 are disposed as the portions which are soldered to the heat conduction pattern 110 of the metal shell 60, and the shell connection lands 74a, 75a disposed on the upper surface of the board 70, and the shell connection lands 74b, 75b disposed on the lower surface of the board 70 are disposed as the shell connection lands of the heat conduction pattern 110. It is more preferable that the upper left and right soldering portions 64a, 65a are disposed as the upper soldering portion for the upper surface of the board 70, the lower left and right soldering portions 64b, 65b are disposed as the lower soldering portion for the lower surface of the board 70, the left and right shell connection lands 74a, 75a are disposed as the shell connection lands which are disposed on the upper surface of the board 70, and the left and right shell connection lands 74b, 75b are disposed as the shell connection lands which are disposed on the lower surface of the board 70.

The single via 112 is disposed as a via through which the left shell connection lands 74a, 74b are connected to the one end portion 111a of the inner-layer conductor pattern 111, and the single via 113 is disposed as a via through which the right shell connection lands 75a, 75b are connected to the other end portion 111b of the inner-layer conductor pattern 111. Alternatively, each of the vias may be configured by a plurality of vias so as to realize a low heat resistance, and heat may be efficiently conducted from the shell connection lands 74a, 74b, 75a, 75b to the inner-layer conductor pattern 111.

The upper insulating layer 70a of the board 70 may be made thinner than the other or middle and lower insulating layers 70a, to reduce the heat resistance of the upper insulating layer 70a, or namely the heat resistance between the middle portion 111c of the inner-layer conductor pattern 111 and the temperature switch IC connection land 77 may be reduced, whereby heat may be efficiently conducted from the middle portion 111c of the inner-layer conductor pattern 111 to the temperature switch IC connection land 77.

Embodiment 2

Figure 17A:
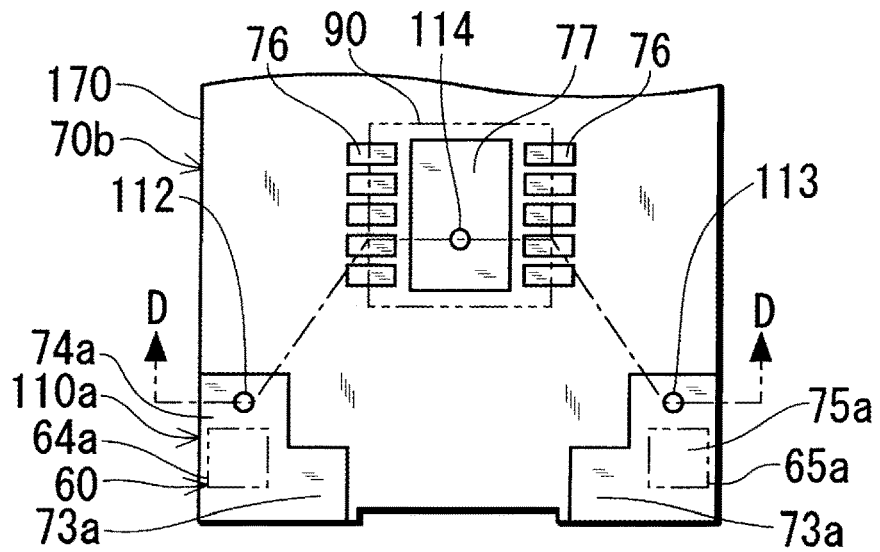
FIGS. 17A to 17C are views showing a heat conduction pattern of a plug connector of Embodiment 2 of the invention.
Figure 17B:
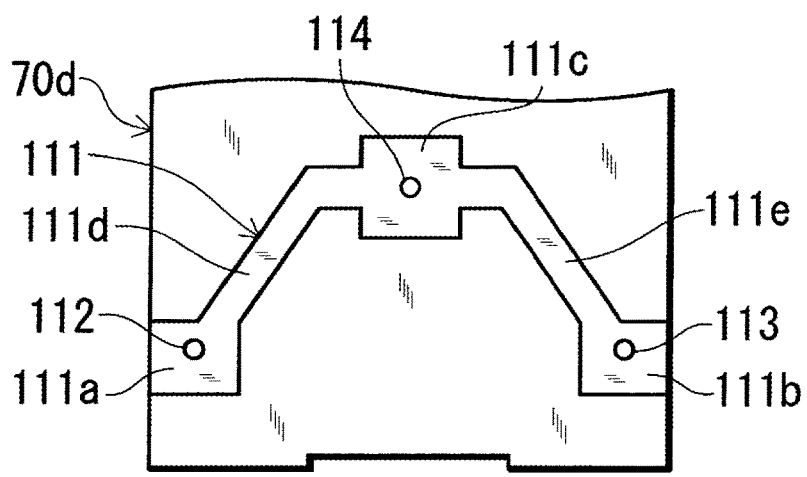
Figure 17C:
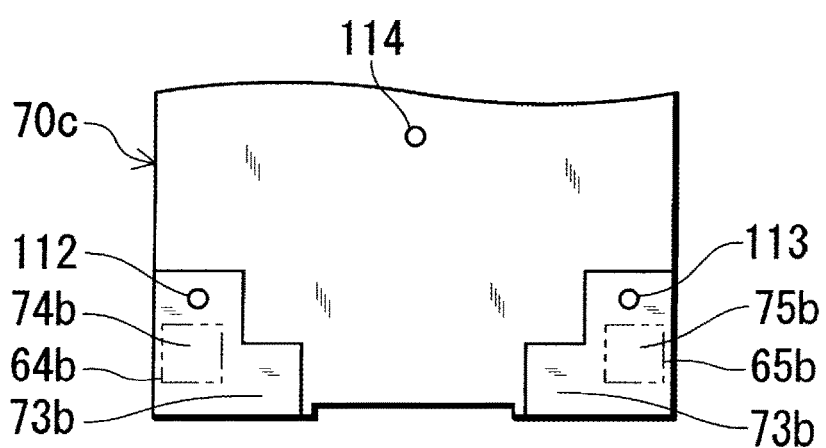
Figure 18:
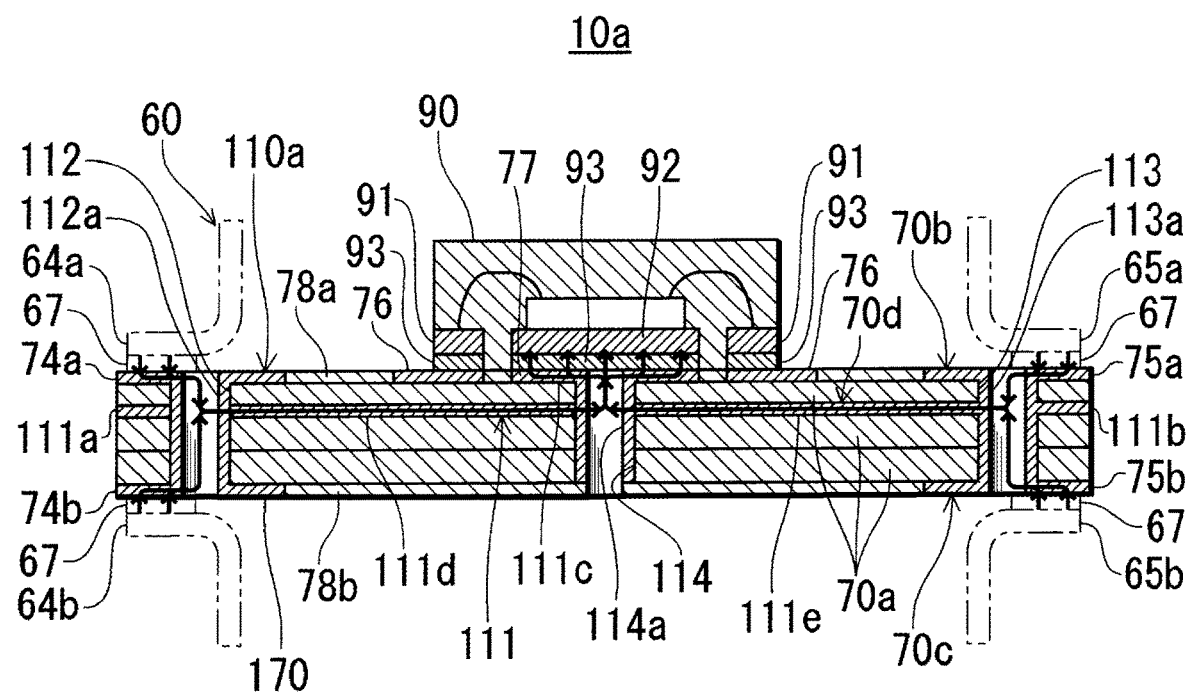
FIG. 18 is a sectional view taken along line D-D in FIG. 17A.

Next, Embodiment 2 of the invention will be described with reference to FIGS. 17A to 18. FIGS. 17A to 18 show a heat conduction pattern 110a of a plug connector (hereinafter, referred to as "plug") 10a of Embodiment 2. FIGS. 17A to 17C are views showing the heat conduction pattern 110a of the plug 10a, FIG. 17A is a plan view showing the heat conduction pattern 110a included in the surface layer 70b of the upper surface of a printed circuit board (hereinafter, referred to as "board") 170, FIG. 17B is a plan view showing the heat conduction pattern 110a included in the inner layer 70d of the board 170, and FIG. 17C is a plan view showing the heat conduction pattern 110a included in the surface layer 70c of the lower surface of the board 170. FIG. 18 is a sectional view taken along line D-D in FIG. 17A.

The embodiment is different from Embodiment 1 in that, in place of the board 70 including the heat conduction pattern 110 in the plug 10 of Embodiment 1, the board 170 including the heat conduction pattern 110a having a different configuration is employed. The same components as those of Embodiment 1 are denoted by the identical reference numerals, and their detailed description is omitted.

As shown in FIGS. 17A to 18, the heat conduction pattern 110a in the embodiment has a configuration where a via 114 which connects between the middle portion 111c of the inner-layer conductor pattern 111 and the temperature switch IC connection land 77 is added in the heat conduction pattern 110 in Embodiment 1.

The other configuration is identical with that of Embodiment 1.

The via 114 is passed from the temperature switch IC connection land 77 on the upper surface 70b of the board 170, through the middle portion 111c of the inner-layer conductor pattern 111, and further passed the whole layers of the board 170 to the solder resist 78b on the lower surface 70c of the board 170. On the inner circumferential surface of the via 114, an inner circumference conductor 114a which is integrated with the temperature switch IC connection land 77 and the middle portion 111c of the inner-layer conductor pattern 111 is formed by, for example, copper plating.

Next, the function of the heat conduction pattern 110a will be described.

The abnormal heating occurring in the front end portion of the fitting portion 52 is conducted from the third shell portion 63 which is a cover for the fitting portion 52, to the first shell portion 61 through the second shell portion 62, and then to the soldering portions 64a, 64b, 65a, 65b connected to the heat conduction pattern 110a in the rear end portion of the metal shell 60.

As indicated by the arrows in FIG. 18, the heat conduction pattern 110a conducts the heat conducted to the soldering portions 64a, 64b, 65a, 65b in the rear end portion of the metal shell 60, to the left and right shell connection lands 74a, 75a, 74b, 75b through the solder 67, then to the one end portion 111a and other end portion 111b of the inner-layer conductor pattern 111 through the left and right vias 112, 113, then to the temperature switch IC connection land 77 from the middle portion 111c of the inner-layer conductor pattern 111 through the via 114, and finally to the heat sink pad 92 on the lower surface of the temperature switch IC 90 from the temperature switch IC connection land 77 through the solder 93.

[Function and Effect]

As described above, according to the plug 10a of the embodiment, the heat conduction pattern 110a further includes the via 114 which connects between the inner-layer conductor pattern 111 and temperature switch IC connection land 77 that are stacked with each other in the thickness direction the board 170, and therefore heat of the metal shell 60 can be efficiently conducted to the temperature switch IC 90 by using only conductors made of, for example, copper.

In the embodiment, the single via 114 is disposed as a via which connects between the middle portion 111c of the inner-layer conductor pattern 111 and temperature switch IC connection land 77 that are stacked with each other in the thickness direction of the board 170. Alternatively, the via may be configured by a plurality of vias so as to realize a low heat resistance, and heat may be more efficiently conducted from the middle portion 111c of the inner-layer conductor pattern 111 to the temperature switch IC connection land 77.

Embodiment 3

Figure 19:
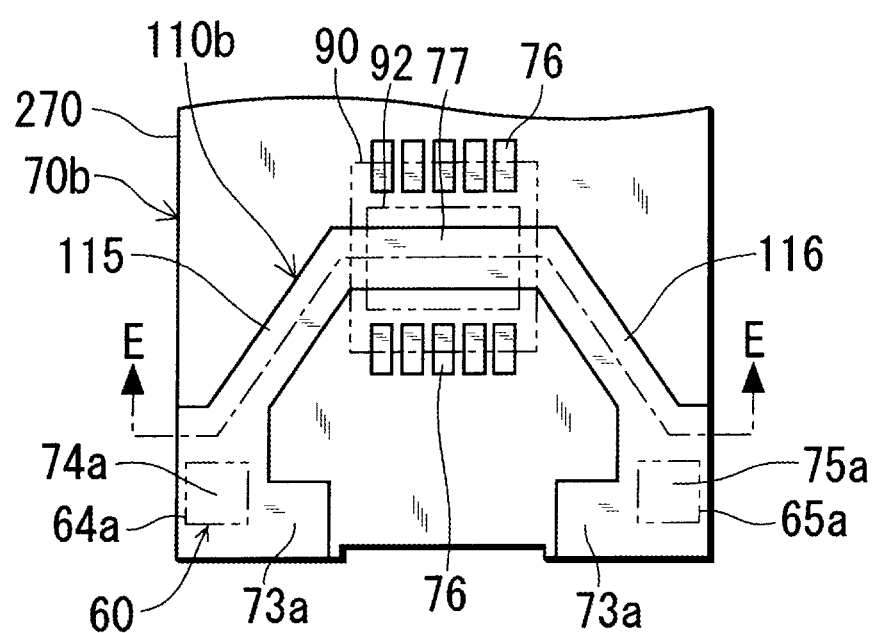
FIG. 19 is a plan view of a printed circuit board showing a heat conduction pattern of a plug connector of Embodiment 3 of the invention (a plan view showing the heat conduction pattern included in the surface layer of the upper surface of the printed circuit board).
Figure 20:
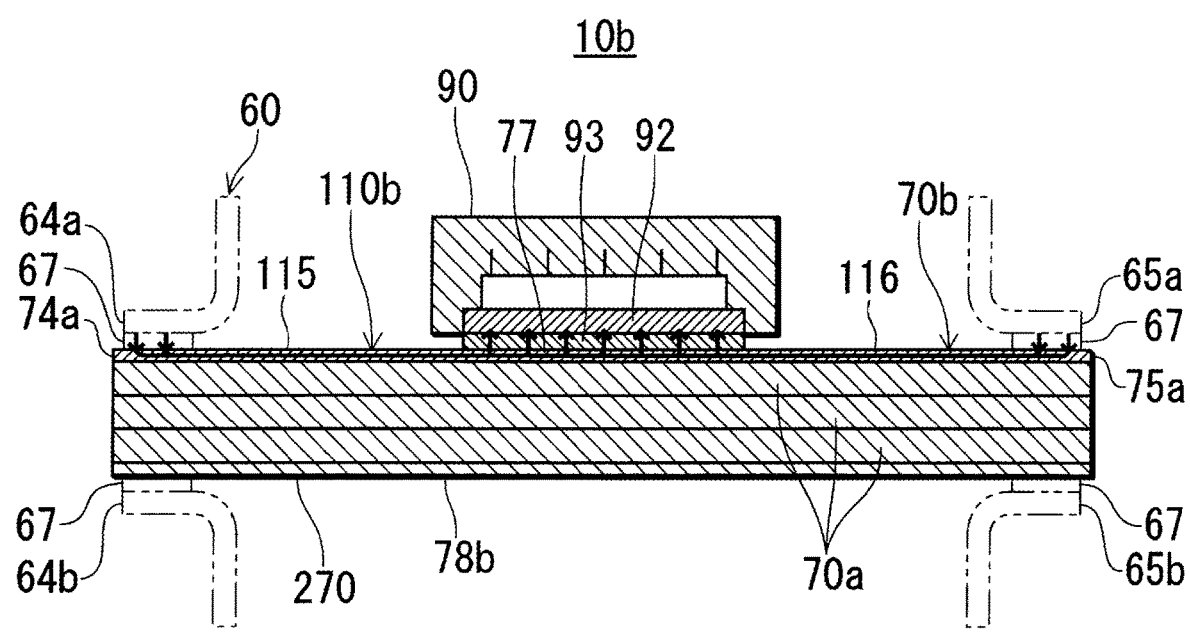
FIG. 20 is a sectional view taken along line E-E in FIG. 19.

Next, Embodiment 3 of the invention will be described with reference to FIGS. 19 and 20. FIGS. 19 and 20 show a heat conduction pattern 110b of a plug connector (hereinafter, referred to as "plug") 10b of Embodiment 3. FIG. 19 is a view showing the heat conduction pattern 110b of the plug 10b, and a plan view of a printed circuit board (hereinafter, referred to as "board") 270 (a plan view showing the heat conduction pattern 110b included in the surface layer 70b of the upper surface of the board 270). FIG. 20 is a sectional view taken along line E-E in FIG. 19.

The embodiment is different from Embodiment 1 in that, in place of the board 70 including the heat conduction pattern 110 in the plug 10 of Embodiment 1, the board 270 including the heat conduction pattern 110b having a different configuration is employed. The same components as those of Embodiment 1 are denoted by the identical reference numerals, and their detailed description is omitted.

As shown in FIGS. 19 and 20, the heat conduction pattern 110b in the embodiment has a configuration where heat of the metal shell 60 is conducted to the temperature switch IC 90 by using only the surface layer 70b of the upper surface of the board 270 on which the temperature switch IC 90 is mounted. The heat conduction pattern 110b is disposed on only the surface layer 70b of the upper surface of the board 270 on which the temperature switch IC 90 is mounted, and includes: the shell connection lands 74a, 75a to which the metal shell 60 is solder-connected; and the temperature switch IC connection land 77 which is connected to the shell connection lands 74a, 75a, and to which the heat sink pad 92 disposed on the lower surface of the temperature switch IC 90 is solder-connected. More specifically, the heat conduction pattern 110b includes: the left and right shell connection lands 74a, 75a; the temperature switch IC connection land 77; a strip-like connecting portion 115 through which the left shell connection land 74a and the temperature switch IC connection land 77 are connected to each other in a substantially shortest distance; and a strip-like connecting portion 116 through which the right shell connection land 75*a* and the temperature switch IC connection land 77 are connected to each other in a substantially shortest distance.

The other configuration is identical with that of Embodiment 1.

Next, the function of the heat conduction pattern 110*b* will be described.

The abnormal heating occurring in the front end portion of the fitting portion 52 is conducted from the third shell portion 63 which is a cover for the fitting portion 52, to the first shell portion 61 through the second shell portion 62, and then to the soldering portions 64*a*, 64*b*, 65*a*, 65*b* connected to the heat conduction pattern 110*b* in the rear end portion of the metal shell 60.

As indicated by the arrows in FIG. 20, the heat conduction pattern 110*b* conducts the heat conducted to the soldering portions 64*a*, 65*a* in the rear end portion of the metal shell 60, to the left and right shell connection lands 74*a*, 75*a* through the solder 67, then to the temperature switch IC connection land 77 through the connecting portions 115, 116 in the surface layer 70*b* of the upper surface of the board 270 on which the temperature switch IC 90 is mounted, and finally to the heat sink pad 92 on the lower surface of the temperature switch IC 90 from the temperature switch IC connection land 77 through the solder 93.

[Function and Effect]

As described above, according to the plug 10*b* of the embodiment, the heat conduction pattern 110*b* is disposed on only the surface layer 70*b* of the upper surface of the board 270 on which the temperature switch IC 90 is mounted, and includes: the shell connection lands 74*a*, 75*a* to which the metal shell 60 is solder-connected; and the temperature switch IC connection land 77 which is connected to the shell connection lands 74*a*, 75*a*, and to which the heat sink pad 92 disposed on the lower surface of the temperature switch IC 90 is solder-connected. Heat of the metal shell 60 is conducted to the temperature switch IC 90 by using only the surface layer 70*b* of the upper surface of the board 270 on which the temperature switch IC 90 is mounted. Therefore, the board 270 is not required to be a multi-layer board, and may be a single or double-sided board which has no inner layer.

Embodiment 4

Figure 25A:
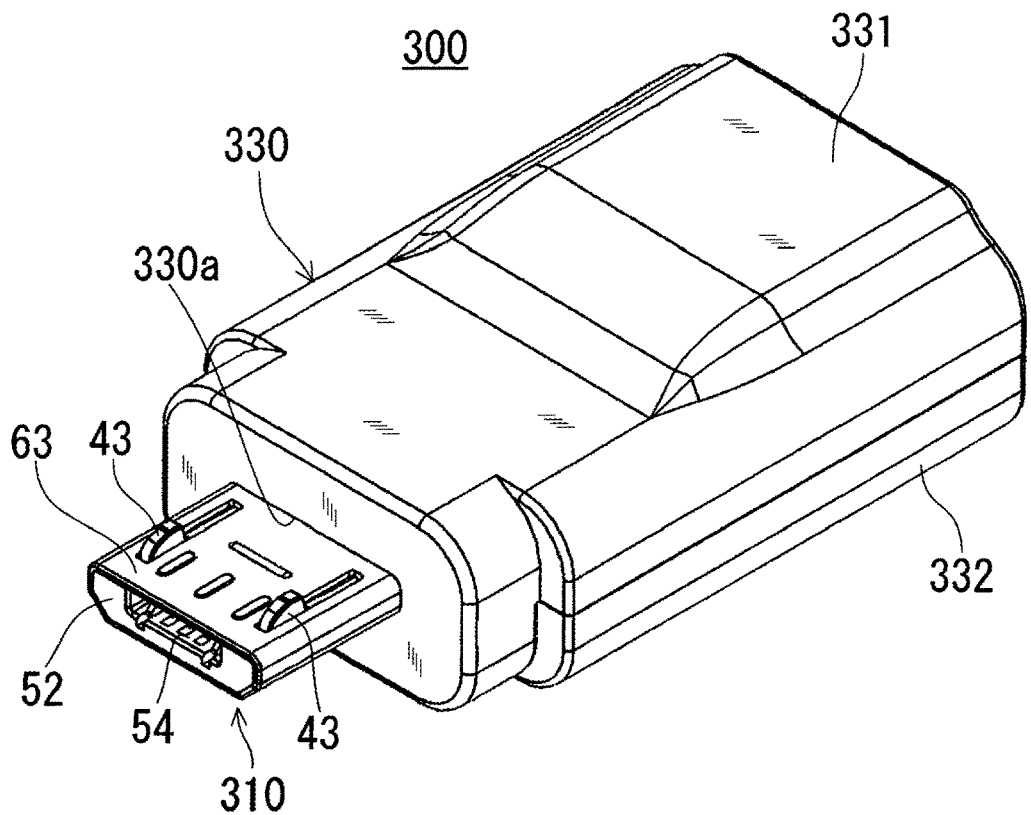
FIGS. 25A and 25B are views showing an adapter of Embodiment 4 of the invention.
Figure 25B:
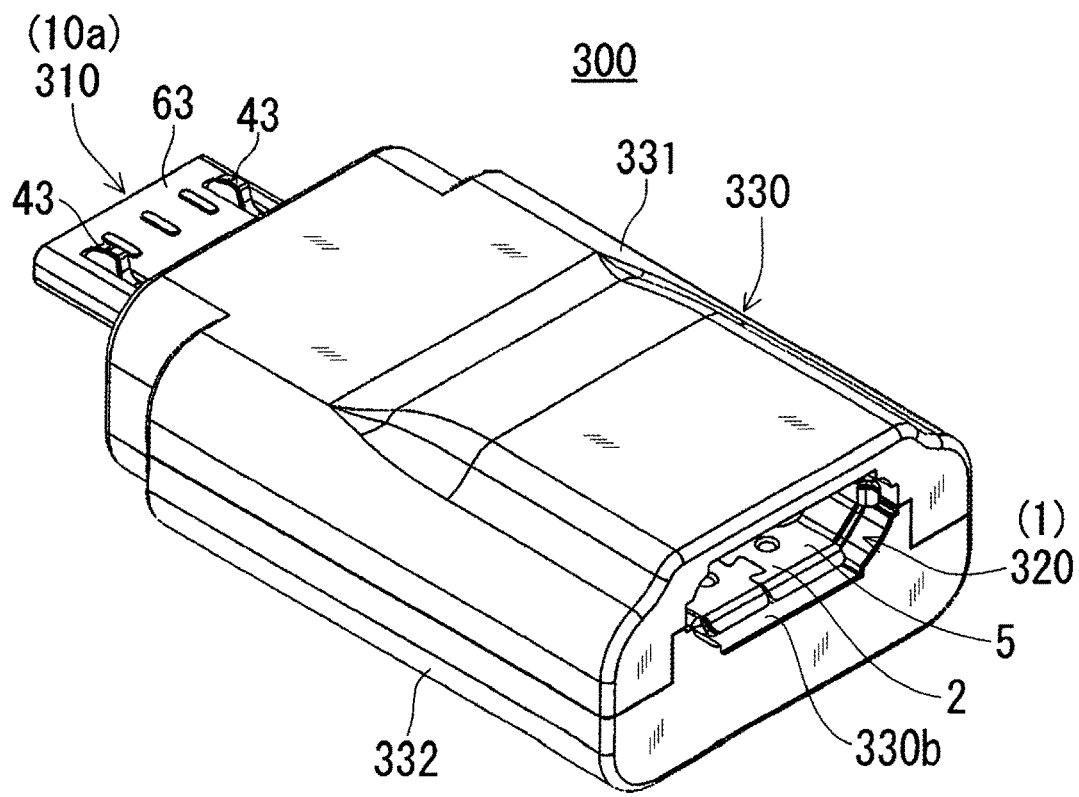
Figure 27:
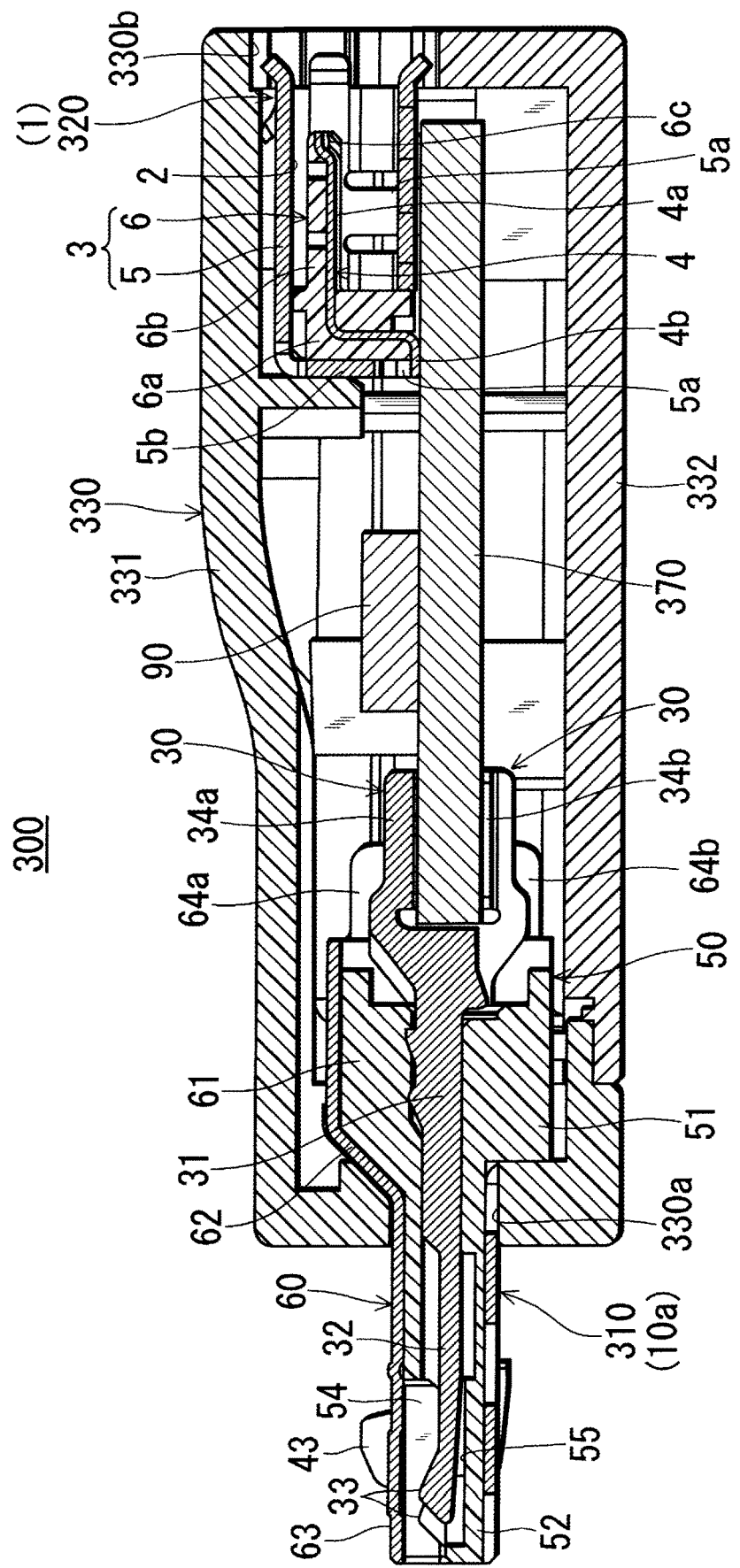
FIG. 27 is a sectional view taken along line F-F in FIG. 26A.
Figure 28:
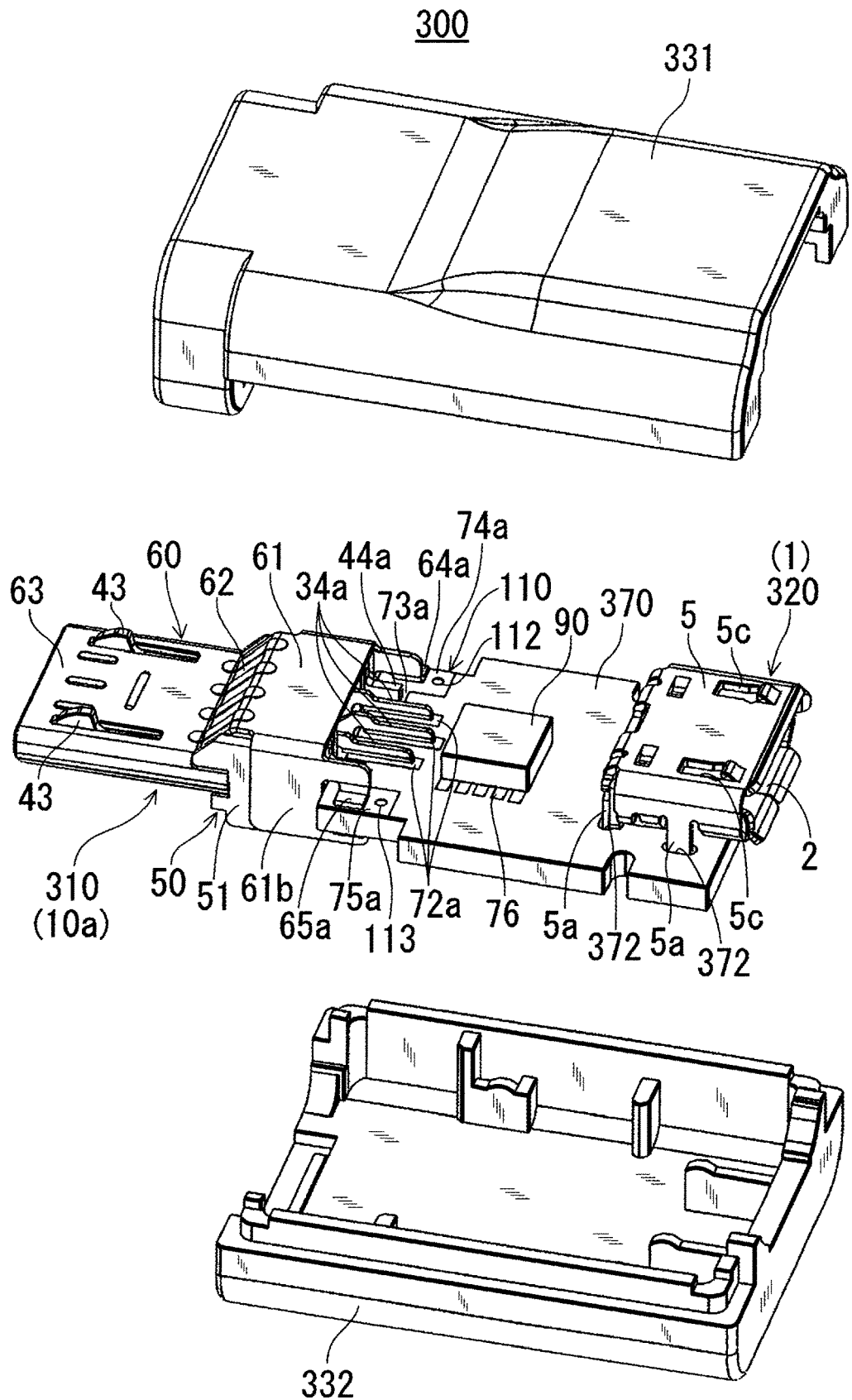
FIG. 28 is an exploded perspective view of the adapter of Embodiment 4 of the invention, as viewed from an obliquely upper side.
Figure 29:
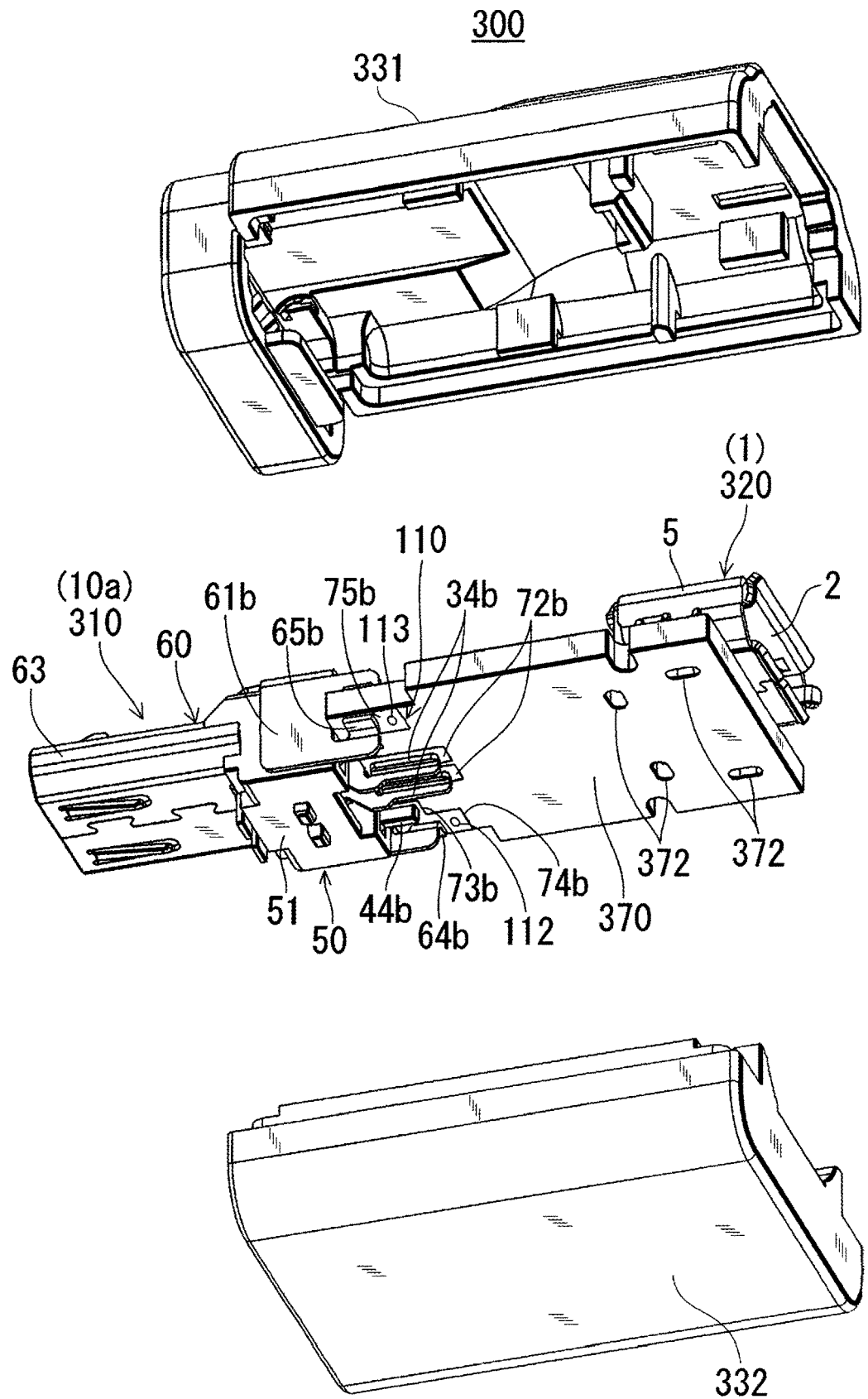
FIG. 29 is an exploded perspective view of the adapter of Embodiment 4 of the invention, as viewed from an obliquely lower side.
Figure 30:
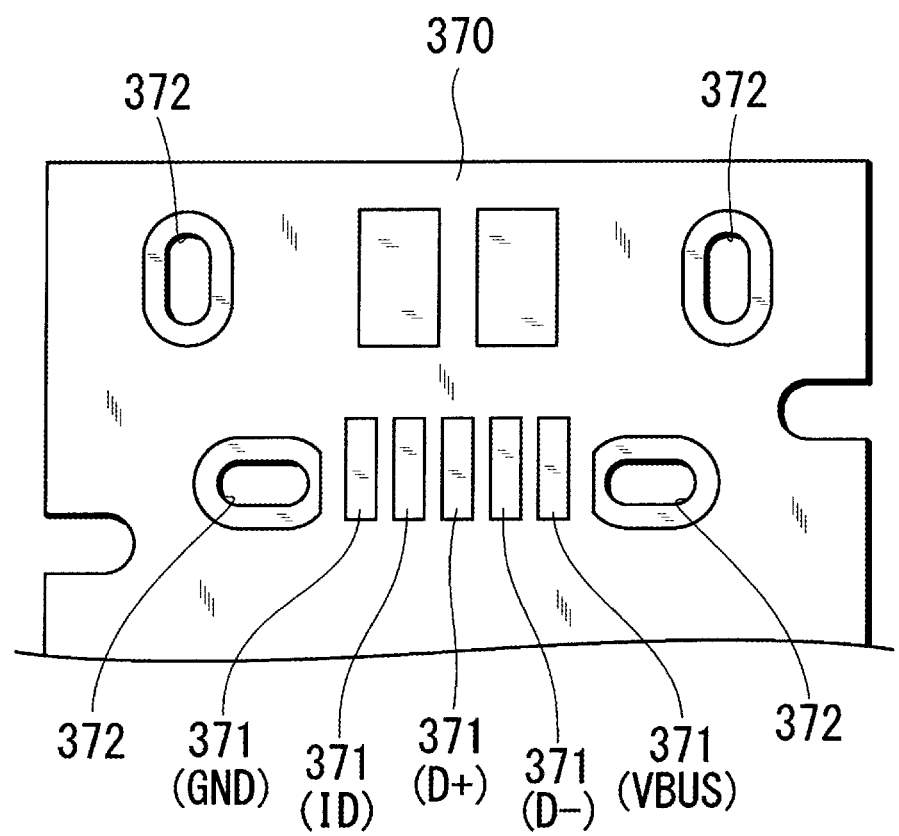
FIG. 30 is a partial plan view of a printed circuit board of the adapter of Embodiment 4 of the invention, showing a second connector connecting portion included in the printed circuit board.

Next, Embodiment 4 of the invention will be described with reference to FIGS. 25A to 30. FIGS. 25A to 29 show an adapter 300 of Embodiment 4. FIGS. 25A and 25B are views showing the appearance of the adapter 300, FIG. 25A is a perspective view of the adapter 300 as viewed from an obliquely upper front side, and FIG. 25B is a perspective view of the adapter 300 as viewed from an obliquely upper rear side. FIGS. 26A to 26D are views showing the appearance of the adapter 300, FIG. 26A is a front view of the adapter 300, FIG. 26B is a plan view of the adapter 300, FIG. 26C is a right-side view of the adapter 300, and FIG. 26D is a rear view of the adapter 300. FIG. 27 is a sectional view taken along line F-F in FIG. 26A. FIG. 28 is an exploded perspective view of the adapter 300, as viewed from an obliquely upper side. FIG. 29 is an exploded perspective view of the adapter 300, as viewed from an obliquely lower side. FIG. 30 is a partial plan view of a printed circuit board 370 of the adapter 300, showing a second connector connecting portion included in the printed circuit board 370.

As shown in FIGS. 25A to 29, the adapter 300 of the embodiment includes the plug connector according to any one of claims 1 to 6, as a first connector 310, and further includes: a second connector 320 which is mounted on a printed circuit board (hereinafter, referred to as "board") 370 of the first connector 310; and a housing 330 which covers the board 370 in a state where the first connector 310 and the second connector 320 are fittable to respective counter connectors.

In the embodiment, the first connector 310 is the plug 10*a* in Embodiment 2, and the second connector 320 is the receptacle 1 of a counter connector which is fittable to the first connector 310. With respect to the first connector 310, the same components as those of the plug 10*a* are denoted by the identical reference numerals, and their detailed description is omitted. With respect to the second connector 320, the same components as those of the receptacle 1 are denoted by the identical reference numerals, and their detailed description is omitted.

In place of the cable 20, the second connector 320 is mounted on a rear portion of the upper surface of the board 370 of the first connector 310. In the second connector 320, the plug inserting portion 2 is opened toward the rear side.

The board 370 includes a second connector connecting portion in place of the cable connecting portion including the cable connection lands 71*a*, 71*b*. As shown in FIG. 30, the second connector connecting portion includes contact connection lands 371 to which the surface-mount soldering portions 4*b* of the contacts 4 are solder-connected, and shell connection through holes 372 to which the insertion-mount soldering portions 5*a* of the metal shell 5 are solder-connected.

In the board 370, the four contact connection lands 72*a*, 72*b* other than the land for identification (ID), and the four contact connection lands 371 corresponding to the contact connection lands are connected to each other, respectively, and the four contacts 30 other than the contact for identification (ID), and the four contacts 4 corresponding to the contacts are electrically connected to each other, respectively. The contact connection land 72*b*, 371 for identification (ID) are not connected to any terminal, and the contacts 30, 4 for identification (ID) are set as an idle terminal (N/C: Not Connected). Similarly with the board 170, the board 370 includes the thermal protection circuit 80 and the heat conduction pattern 110.

In place of the inner mold 120 and the over mold 130, the housing 330 convers the periphery of the board 370. Specifically, the housing 330 includes a tubular side wall portion which convers the periphery of the board 370, a front wall having a plug projection hole 330*a* through which the fitting portion 52 of the first connector 310 is projected, and a rear wall having a plug insertion hole 330*b* for the plug inserting portion 2 of the second connector 320.

The housing 330 includes an upper half housing 331 which has an engaging portion, and which is made of an insulating synthetic resin, and a lower half housing 332 which has an engaging portion, and which is made of an insulating synthetic resin, and is assembled by combining together the half housings in a state where the engaging portions are engaged with each other. The upper half housing 331 includes all of the front wall having the plug projection hole 330*a*, to function as the housing body, and the lower half housing 332 functions as a cover which covers the downwardly directed opening of the upper half housing 331.

The adapter 300 is assembled in the following manner. As shown in FIGS. 28 and 29, the first connector 310 in which the second connector 320 is solder-connected (mounted) to the second connector connecting portion of the board 370 is attached to the upper half housing 331, and thereafter the housing 330 is assembled by combining the lower half housing 332 with the upper half housing 331. As shown in FIGS. 25A to 27, as a result, the adapter is completed in a state where the basal portion 51 of the first connector 310, and the whole second connector 320 are housed together with the board 370 in the housing 330, the fitting portion 52 of the first connector 310 is projected from the plug projection hole 330a in the front wall of the housing 330 to the front side in the insertion direction of the counter connector, and the plug inserting portion 2 of the second connector 320 is opened toward the plug insertion hole 330b which is in the rear wall of the housing 330.

When the adapter 300 is used, an existing micro-USB (2.0) plug connector on which the thermal protection circuit 80 is not mounted can be converted to a micro-USB (2.0) plug connector on which the thermal protection circuit 80 is mounted. Namely, the first connector 310 of the adapter 300 is the plug 10a, i.e., a micro-USB (2.0) plug connector, and the second connector 320 of the adapter 300 is the receptacle 1 of a counter connector which is fittable to the plug 10a, i.e., a micro-USB (2.0) receptacle connector of a counter connector which is fittable to a micro-USB (2.0) plug connector. When an existing micro-USB (2.0) plug connector on which the thermal protection circuit 80 is not mounted is connected to the second connector 320 of the adapter 300, therefore, the existing plug connector can be converted to a micro-USB (2.0) plug connector on which the thermal protection circuit 80 is mounted.

[Function and Effect]

As described above, the adapter 300 of the embodiment includes the plug 10a of Embodiment 2 as the first connector 310, and further includes the second connector 320 which is mounted on the board 370 of the first connector 310, and the housing 330 which covers the board 370 in a state where the first connector 310 and the second connector 320 are fittable to respective counter connectors. Therefore, the current supply can be cut off with high sensitivity to abnormal heating occurring in the fitting portion 52 of the first connector 310 with the receptacle 1 of the counter connector.

The first connector 310 of the adapter 300 may be the plug connector according to any one of claims 1 to 6. The plug connector according to any one of claims 1 to 7 is not limited to a micro-USB (2.0) plug connector, and may be another plug connector. For example, the first connector 310 of the adapter 300 may be the plug 10 of Embodiment 1, the plug 10b of Embodiment 3, another USB Type-C plug connector, or the like.

In the case where the first connector 310 of the adapter 300 is a USB Type-C plug connector, an existing micro-USB (2.0) plug connector on which the thermal protection circuit 80 connected to the second connector 320 is not mounted can be converted to a USB Type-C plug connector on which the thermal protection circuit 80 is mounted.

The second connector 320 of the adapter 300 is not limited to a counter connector which is fittable to the first connector 310, and may be another receptacle connector or plug connector. For example, the second connector 320 of the adapter 300 may be a USB receptacle connector, USB Type-C receptacle connector, an HDMI (registered trademark) receptacle, or the like.

In the case where the second connector 320 of the adapter 300 is a USB receptacle connector, an existing USB plug connector on which the thermal protection circuit 80 connected to the second connector 320 is not mounted can be converted to a micro-USB (2.0) plug connector on which the thermal protection circuit 80 is mounted.

DESCRIPTION OF REFERENCE NUMERALS 1 receptacle connector
10, 10a, 10b plug connector
20 cable
30 contact
50 body
52 fitting portion
60 metal shell
64a, 65a, 64b, 65b soldering portion
70, 170, 270 printed circuit board
70b surface layer
70c surface layer
70d inner layer
74a, 74b, 75a, 75b shell connection land
77 temperature switch IC connection land
80 thermal protection circuit
90 temperature switch IC
92 heat sink pad
100 FET
110, 110a, 110b heat conduction pattern
111 inner-layer conductor pattern
112, 113, 114 via
300 adapter
310 first connector
320 second connector
330 housing
370 printed circuit board

The invention claimed is:

1. A plug connector, comprising:
a plurality of contacts;
a body that holds the plurality of contacts, the body comprises a fitting portion which is projected, and which is to be fitted with a counter connector;
a metal shell that covers the body; and
a printed circuit board to which the plurality of contacts are solder-connected, the printed circuit board comprises a thermal protection circuit, and the thermal protection circuit comprises:
a temperature switch IC that detects a temperature; and
an FET that is disposed in a power supply wiring of the printed circuit board, and, when a detected temperature of the temperature switch IC exceeds a predetermined temperature, causes the FET to cut off the power supply wiring, wherein
the printed circuit board comprises a heat conduction pattern that conducts heat of the metal shell to the temperature switch IC, and
the heat conduction pattern comprises a portion that overlaps with the temperature switch IC in a thickness direction of the printed circuit board.

2. A plug connector in which the plug connector comprises: a plurality of contacts; a body which holds the plurality of contacts; a metal shell which covers the body; and a printed circuit board to which the plurality contacts are solder-connected, the body comprises a fitting portion which is projected, and which is to be fitted with a counter connector, the printed circuit board comprises a thermal protection circuit, and the thermal protection circuit comprises: a temperature switch IC which detects a temperature; and an FET which is disposed in a power supply wiring of the printed circuit board, and, when a detected temperature of the temperature switch IC exceeds a predetermined temperature, causes the FET to cut off the power supply wiring, wherein
the printed circuit board comprises a heat conduction pattern which conducts heat of the metal shell to the temperature switch IC,
the heat conduction pattern comprises a portion which overlaps with the temperature switch IC in a thickness direction of the printed circuit board, the printed circuit board is a multi-layer board, the temperature switch IC is surface-mounted on the printed circuit board, the heat conduction pattern is disposed on at least one surface layer of the printed circuit board, and comprises: a shell connection land to which the metal shell is solder-connected; an inner-layer conductor pattern that is disposed on an inner layer adjacent to the surface layer of the printed circuit board on which the temperature switch IC is mounted; a via which connects between the shell connection land and the inner-layer conductor pattern; and a temperature switch IC connection land that is disposed on a surface layer of the printed circuit board on which the temperature switch IC is mounted, a pad that is disposed on a lower surface of the temperature switch IC being solder-connected to the temperature switch IC connection land, and the inner-layer conductor pattern comprises a portion which overlaps with the temperature switch IC connection land in the thickness direction of the printed circuit board.

3. A plug connector in which the plug connector comprises: a plurality of contacts; a body which holds the plurality of contacts; a metal shell which covers the body; and a printed circuit board to which the plurality of contacts are solder-connected, the body comprises a fitting portion which is projected, and which is to be fitted with a counter connector, the printed circuit board comprises a thermal protection circuit, and the thermal protection circuit comprises: a temperature switch IC which detects a temperature; and an FET which is disposed in a power supply wiring of the printed circuit board, and, when a detected temperature of the temperature switch IC exceeds a predetermined temperature, causes the FET to cut off the power supply wiring, wherein the printed circuit board comprises a heat conduction pattern which conducts heat of the metal shell to the temperature switch IC, the heat conduction pattern comprises a portion which overlaps with the temperature switch IC in a thickness direction of the printed circuit board, the printed circuit board is a multi-layer board, the temperature switch IC is surface-mounted on the printed circuit board, the heat conduction pattern is disposed on at least one surface layer of the printed circuit board, and comprises: a shell connection land to which the metal shell is solder-connected; an inner-layer conductor pattern that is disposed on an inner layer adjacent to the surface layer of the printed circuit board on which the temperature switch IC is mounted; a via which connects between the shell connection land and the inner-layer conductor pattern; and a temperature switch IC connection land that is disposed on a surface layer of the printed circuit board on which the temperature switch IC is mounted, a pad that is disposed on a lower surface of the temperature switch IC being solder-connected to the temperature switch IC connection land, the inner-layer conductor pattern comprises a portion which overlaps with the temperature switch IC connection land in the thickness direction of the printed circuit board, and the heat conduction pattern further comprises another via which connects between the inner-layer conductor pattern and temperature switch IC connection land that overlap with each other in the thickness direction of the printed circuit board.

4. The plug connector according to claim 1, wherein the temperature switch IC comprises the FET.

5. The plug connector according to claim 1, wherein the plug connector further comprises a cable which is solder-connected to the printed circuit board.

6. The plug connector according to claim 1, wherein the temperature switch IC comprises the FET, and
the plug connector further comprises a cable which is solder-connected to the printed circuit board.

7. An adapter wherein the adapter comprises the plug connector according to claim 1, as a first connector, and further comprises: a second connector which is mounted on the printed circuit board of the first connector; and a housing which covers the printed circuit board in a state where the first connector and the second connector are fittable to respective counter connectors.

8. The plug connector according to claim 2, wherein the temperature switch IC comprises the FET.

9. The plug connector according to claim 2, wherein the plug connector further comprises a cable which is solder-connected to the printed circuit board.

10. The plug connector according to claim 2, wherein the temperature switch IC comprises the FET, and
the plug connector further comprises a cable which is solder-connected to the printed circuit board.

11. An adapter wherein the adapter comprises the plug connector according to claim 2, as a first connector, and further comprises: a second connector which is mounted on the printed circuit board of the first connector; and a housing which covers the printed circuit board in a state where the first connector and the second connector are fittable to respective counter connectors.

12. The plug connector according to claim 3, wherein the temperature switch IC comprises the FET.

13. The plug connector according to claim 3, wherein the plug connector further comprises a cable which is solder-connected to the printed circuit board.

14. The plug connector according to claim 3, wherein the temperature switch IC comprises the FET, and
the plug connector further comprises a cable which is solder-connected to the printed circuit board.

15. An adapter wherein the adapter comprises the plug connector according to claim 3, as a first connector, and further comprises: a second connector which is mounted on the printed circuit board of the first connector; and a housing which covers the printed circuit board in a state where the first connector and the second connector are fittable to respective counter connectors.

* * * * *